United States Patent
Umamoto

(10) Patent No.: US 9,638,730 B2
(45) Date of Patent: May 2, 2017

(54) DEMAND TARGET DISPLAY DEVICE

(71) Applicant: NIHON TECHNO CO., LTD., Shinjuku-ku, Tokyo (JP)

(72) Inventor: Eiichi Umamoto, Tokyo (JP)

(73) Assignee: NIHON TECHNO CO., LTD. (JP)

( * ) Notice: Subject to any disclaimer, the term of this patent is extended or adjusted under 35 U.S.C. 154(b) by 134 days.

(21) Appl. No.: 14/649,613

(22) PCT Filed: Dec. 21, 2012

(86) PCT No.: PCT/JP2012/083270
§ 371 (c)(1),
(2) Date: Jun. 4, 2015

(87) PCT Pub. No.: WO2014/097471
PCT Pub. Date: Jun. 26, 2014

(65) Prior Publication Data
US 2015/0331021 A1    Nov. 19, 2015

(51) Int. Cl.
*G01R 21/00* (2006.01)
*G01R 11/00* (2006.01)
(Continued)

(52) U.S. Cl.
CPC .......... *G01R 21/008* (2013.01); *G01R 11/00* (2013.01); *G01R 11/64* (2013.01); *G01R 21/00* (2013.01);
(Continued)

(58) Field of Classification Search
None
See application file for complete search history.

(56) References Cited

U.S. PATENT DOCUMENTS

| | | | | |
|---|---|---|---|---|
| 4,654,588 A | * | 3/1987 | Munday | ............... G01R 21/007 324/103 R |
| 2003/0004661 A1 | * | 1/2003 | Burns | ................... G01R 35/04 702/61 |

(Continued)

FOREIGN PATENT DOCUMENTS

| | | |
|---|---|---|
| CN | 101949975 A | 1/2011 |
| CN | 102439524 A | 5/2012 |

(Continued)

OTHER PUBLICATIONS

Extended European Search Report for EP Application No. 12890340.8, dated Jul. 15, 2016 (6 pages).

*Primary Examiner* — Paresh Patel
(74) *Attorney, Agent, or Firm* — Harness, Dickey & Pierce, P.L.C.

(57) ABSTRACT

The conventional demand target display device based on time information differing from the information used by electric power companies and electric power consumers causes a divergence regarding their demand values. Therefore, a demand target display device with a dual-purpose scale, which acquires AC signals based on the AC waveform of AC power from a power supply line, generates time information based on the acquired AC signals, transmits the generated time information via radio waves within a housing, receives the transmitted time information via radio waves within the housing, indicates the time on the dual-purpose scale based on the received information, acquires electrical energy consumption within a segment for a given target demand value including the current time, and indicates the relationship between the acquired electrical energy consumption within a segment recorded and a target demand value set for such segment, is proposed.

16 Claims, 16 Drawing Sheets

(51) Int. Cl.
    *G01R 11/64*    (2006.01)
    *G04G 5/00*     (2013.01)
    *G04R 20/00*    (2013.01)
    *G04G 9/00*     (2006.01)
    *G06Q 50/06*    (2012.01)
    *G04C 15/00*    (2006.01)
    *H02J 3/14*     (2006.01)

(52) U.S. Cl.
    CPC ........... *G04C 15/0063* (2013.01); *G04G 5/00* (2013.01); *G04G 9/0064* (2013.01); *G04R 20/00* (2013.01); *G06Q 50/06* (2013.01); *H02J 3/14* (2013.01); *H02J 2003/146* (2013.01); *Y04S 20/224* (2013.01)

(56) References Cited

U.S. PATENT DOCUMENTS

| | | |
|---|---|---|
| 2010/0156666 A1 | 6/2010 | Choi et al. |
| 2013/0121119 A1 | 5/2013 | Umamoto |
| 2013/0286793 A1 | 10/2013 | Umamoto |

FOREIGN PATENT DOCUMENTS

| | | | |
|---|---|---|---|
| CN | 102763045 | A | 10/2012 |
| JP | 2005-167618 | A | 6/2005 |
| JP | 2007-192758 | A | 8/2007 |
| JP | 2008-196986 | A | 8/2008 |
| JP | 2010-060380 | A | 3/2010 |
| JP | 4775749 | B1 | 9/2011 |
| JP | 2012-083107 | A | 4/2012 |
| JP | 2012-085423 | A | 4/2012 |
| KR | 10-2010-0075283 | A | 7/2010 |

\* cited by examiner

Fig. 3
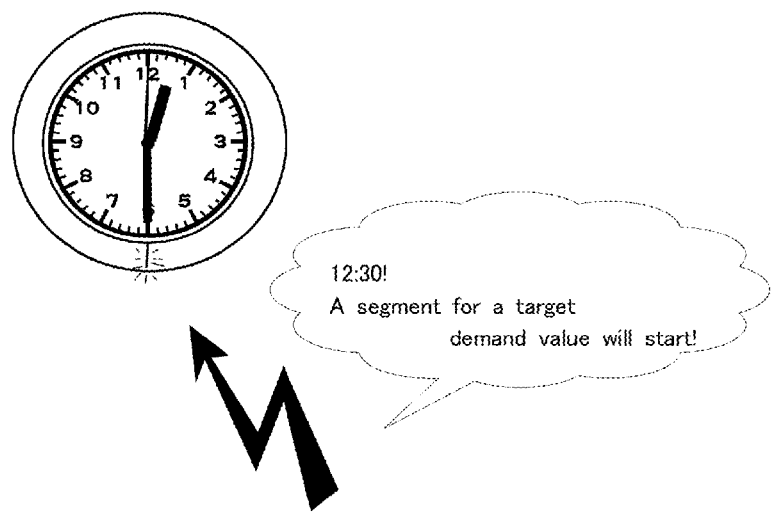
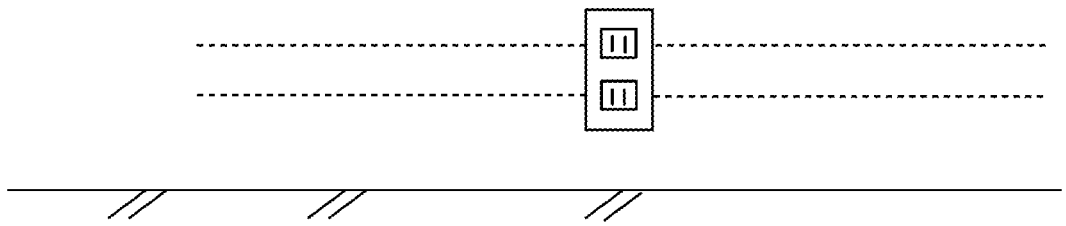

DEMAND TARGET DISPLAY DEVICE

CROSS-REFERENCE TO RELATED APPLICATION

This application is a 371 U.S. National Stage Application of International Application No. PCT/JP2012/083270 filed on Dec. 21, 2012, and published in Japanese as WO 2014/097471 A1 on Jun. 26, 2014. The entire disclosure of the above application is incorporated herein by reference.

FIELD OF THE INVENTION

The present invention relates to a device for displaying a demand target.

BACKGROUND OF THE INVENTION

In an electrical energy usage contract executed between an electric power company and an electric power consumer, electric charges are divided into basic charges, which are fixed-rate portions, and fluctuating-rate portions, which are determined based on consumed electrical energy. The total of both portions described above is computed as electricity charges, and is borne by consumers. The basic method for establishment of the basic charges, which are the fixed-rate portions as stated above, is described as follows. That is to say, electric power companies integrate electrical energy continuously consumed by electric power consumers during multiple given time segments (e.g., 30 minutes each). The electrical energy obtained as a result of the aforementioned integration is measured as a demand value for the relevant time segments. The monetary amount that matches the predetermined reference value corresponding to the largest demand value (i.e., maximum demand value) among demand values measured as above within a previous predetermined period (e.g., 1 year) is used as a basic charge for the subsequent prescribed period.

The aforementioned system will be explained in detail with reference to FIG. 1. FIG. 1 is a bar graph indicating changes in monthly demand values of electric power consumers. The term "monthly demand value" refers to the maximum demand value within a corresponding month. The vertical axis of FIG. 1 represents electrical energy demand value. The predetermined period stated above is set to be one year from July 1 of each year through the last day of June of the following year. The monthly basic charge for the year from July 2010 through June 2011 is assumed to have been 2,800 yen.

As shown in FIG. 1, as a result of a sharp increase in electrical energy usage in June 2011, 3,200 yen, which was the basic charge for the coming year, was exceeded by the corresponding electric power consumer. In this case, 3,200 yen was used as the yearly basic charge starting July. That is to say, the basic charge increased by 400 yen, which was approximately a 14% increase over the previous charge. No matter how far the demand value fell, 3,200 yen remained the basic charge. Additionally, in the case of major electric power consumers, if demand values exceed the electrical energy values determined upon execution of contracts, penalties, such as penalty charges corresponding to such excesses, may be imposed on such consumers.

As described above, in case that a demand value increases even temporarily, even if such demand value subsequently falls, the basic charge will be fixed at a high level. Therefore, electricity consumption activities (i.e., energy-saving actions) that allow lower demand values serve the medium- and long-term economic interests of individual electric power consumers. Therefore, conventionally, technologies that allow the extent to which demand value has changed to be displayed based on a relationship with the reference value upon determining basic charges for electric power companies for a predetermined time segment and allow easy understanding of such changes have been demanded.

In this regard, in Japanese Examined Patent Application Publication No. No. 4775749, an example of the technology used for a demand target display device is disclosed. This device sets up predetermined reference values for computation of basic electric charges as upper limit targets (i.e., target demand values), and displays the relationships between such target demand values and demand values at predetermined times using a disc-shaped clock outer edge.

SUMMARY OF THE INVENTION

Problems to be Solved by the Invention

In recent years, a technology using standard time radio waves as a method for clocking of time via timepieces has been known. That is to say, an apparatus for indicating the time is configured to receive standard time radio waves at predetermined times. Thereby, it is possible to indicate the accurate time without imposing the need for users to expend effort adjusting the time. Many of the apparatuses for indicating the time, including clocks in widespread use, use a method for receiving standard time radio waves as a means of acquisition of time information due to their high degree of convenience.

Upon measuring demand values at predetermined times, electric power companies use electrical signals transmitted via electric cables provided by such companies, as described in detail below, rather than using standard time radio waves, as described above.

FIG. 2 shows an outline of a method for measuring demand values by electric power companies and electric power consumers. As shown in FIG. 2, electric power companies acquire time information via a "wattmeter" (0201) based on the AC waveform of AC power provided by such companies. A "demand target display device" (0202) used in the conventional technology receives "standard time radio waves" (0203), measures demand values at predetermined times, and indicates information on the same, in the same manner as that used to collect time information allowing such device to indicate the time. That is to say, the methods for measurement of demand values and the times displayed through such methods have been different for electric power companies and for electric power consumers.

As described above, a divergence occurs between demand values of electric power consumers that are measured and acquired by electric power companies at a given time and demand values recognized by corresponding electric power consumers via the demand target display device due to a difference in information. As a result of the aforementioned divergence, even if actual demand values exceed target demand values, for example, electric power consumers could mistakenly believe that the demand values had not exceeded such target demand values. As a result, a situation in which electric power consumers must bear expensive basic charges over the long term could occur. In regard to an apparatus for indicating demand targets based on time information differing from the information used by electric power companies, as in the case of the conventional technology described above, a situation could arise in which the economic interests of electric power consumers who trust the information indicated via the demand target display device would be harmed, and the need to avoid such situation exists.

Due to regional and locational environmental constraints on the reception of standard time radio waves, constant errors upon clocking of time have occurred, or reception of standard time radio waves was difficult in the first place. Specifically, time display devices installed in mountain areas and underground at great distances from locations transmitting standard time radio waves are installed in an environment in which reception of standard time radio waves is difficult. Thus, it is impossible to receive standard time radio waves for time adjustment on a regular basis. Therefore, it has been difficult to indicate the relationship between demand values and target demand values based on accurate time information in the aforementioned locations.

Means for Solving the Problems

In order to solve the various aforementioned problems all at once, the present invention proposes a demand target display device comprising a dual-purpose scale for indicating time and electrical energy consumption, a time indication unit for indicating time via the dual-purpose scale, an electrical energy consumption acquisition unit for acquiring electrical energy consumed up to the current time within a given segment for a given target demand value including the current time, a goal achievement indication unit for indicating the relationship between electrical energy consumption within a given segment recorded via the electrical energy consumption acquisition unit and a target demand value set for such segment, an AC signal acquisition unit for acquiring AC signals based on the AC waveform of AC power from a power supply line, a time information generation unit for generating time information based on the acquired AC signals, a transmission unit for transmitting the generated time information via radio waves within a housing, a reception unit for receiving the transmitted time information via radio waves within the housing, and a time indication unit control unit for controlling the time indication unit via the received time information.

Effects of the Invention

According to the present invention having the main configuration described above, it is possible to allow electric power consumers under various environments to recognize demand values that do not differ from those recognized by electric power companies, thus allowing such consumers to recognize the relationship between such demand values and target demand values and encouraging them to undertake energy-saving actions in a timely manner.

BRIEF DESCRIPTION OF THE DRAWINGS

FIG. 3 is a diagram of a demand target display device of a first embodiment and a fourth embodiment.

DETAILED DESCRIPTIONS OF PREFERRED EMBODIMENTS

Embodiments of the present invention will be described hereinafter with reference to the drawings. The mutual relationship between the embodiments and the aspects of the present disclosure is described as follows. A first embodiment will mainly describe the first aspect of the present disclosure. A second embodiment will mainly describe the second aspect of the present disclosure. A third embodiment will mainly describe the third aspect of the present disclosure. A fourth embodiment will mainly describe the fourth aspect of the present disclosure. A fifth embodiment will mainly describe the fifth aspect of the present disclosure. The present invention is not limited to the above embodiments and may be embodied in various forms without exceeding the scope thereof. (The same shall apply throughout the specifications and drawings.)

First Embodiment

Concept of First Embodiment

Figure 1:
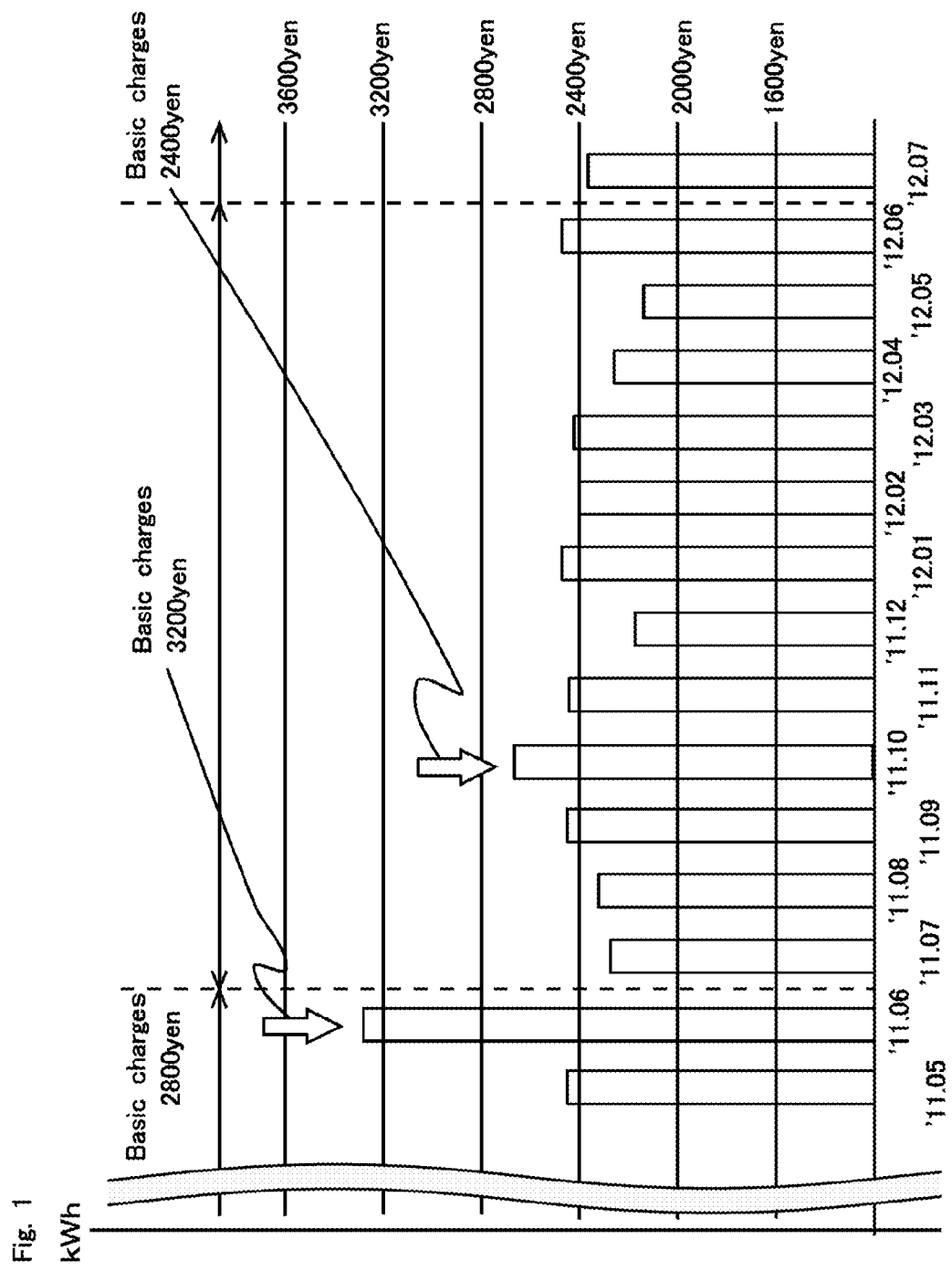
FIG. 1 is a bar graph showing changes in monthly demand values for electric power consumers.
Figure 2:
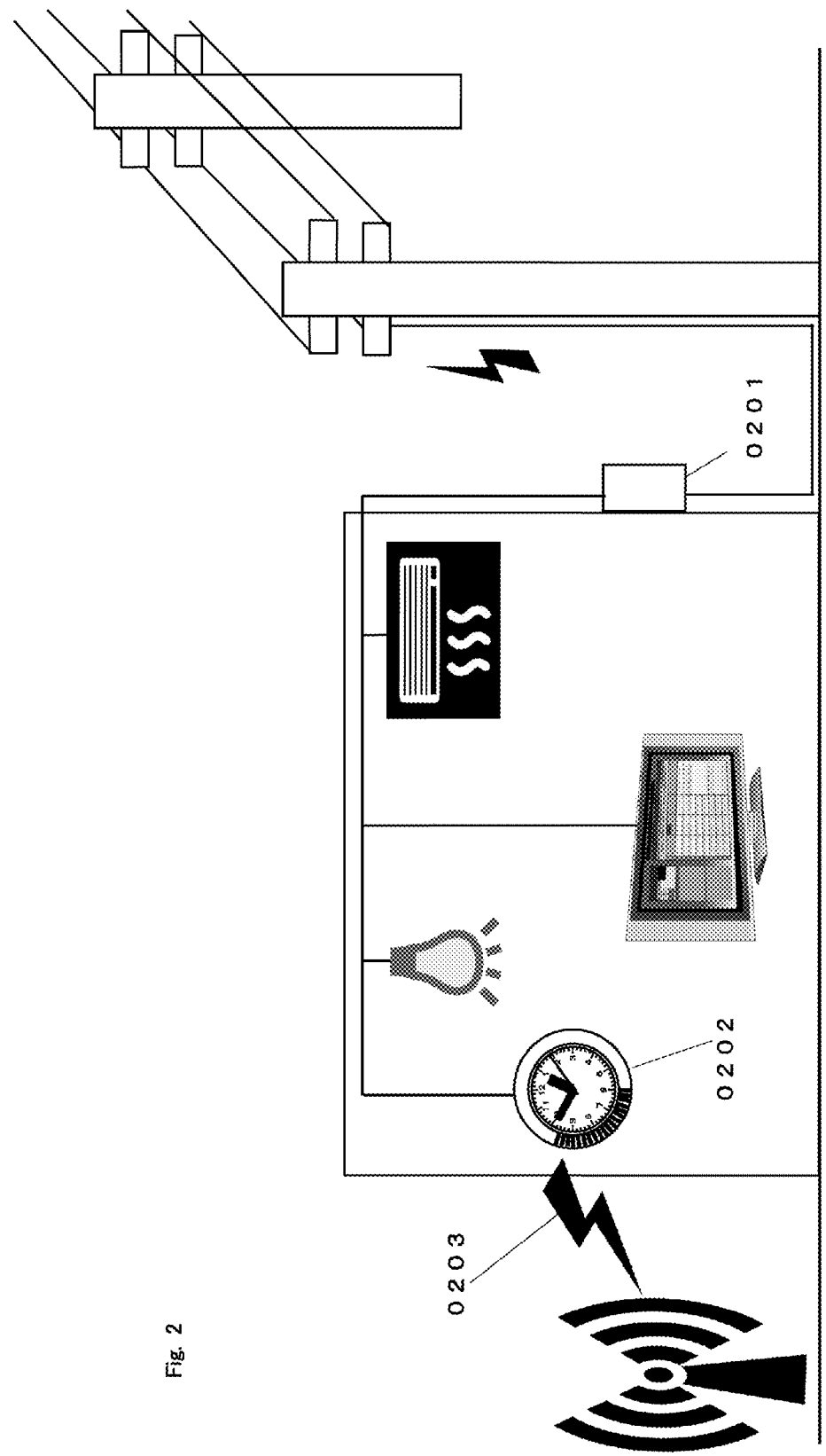
FIG. 2 is a diagram showing an outline of demand value measurement by electric power companies and electric power consumers.

FIG. 3 is a diagram of a demand target display device of a first embodiment and a fourth embodiment. As shown in FIG. 1, while receiving power via power supply lines, simultaneously, the demand target display device of the first embodiment acquires information on power consumption for the identification of basic charges as well as the time information used to present the time that becomes the starting point of a segment for a given target demand value that includes the current time. The demand target display device indicates the relationship between maximum demand (i.e., demand value) and target demand value, and such relationship is associated with time. When electric power consumers look at a display device with the aforementioned configuration, they are able to accurately understand the degree to which an actual demand value achieves the relevant target. (Moreover, such value does not differ from that recognized by the electric power company.) Such understanding regarding target demand values can be achieved at all locations at which consumers are able to receive energy supply. It is possible for such consumers to reduce electrical energy consumed by undertaking energy-saving actions based on the aforementioned degree of target achievement instantaneously.

Functional Configuration of First Embodiment

Figure 4:
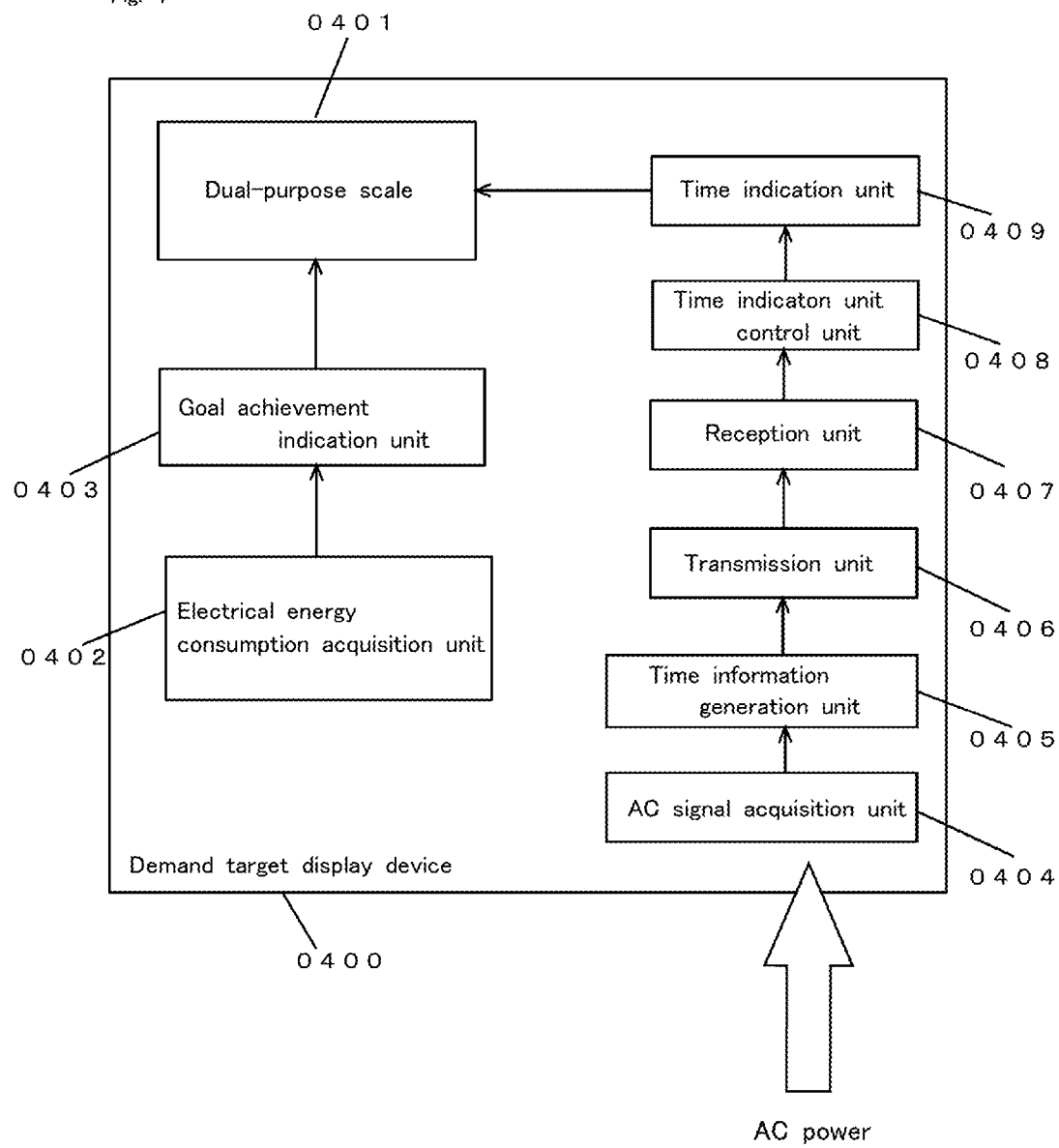
FIG. 4 is a diagram showing an example of functional block diagram of the demand target display device of the first embodiment.
Figure 5:
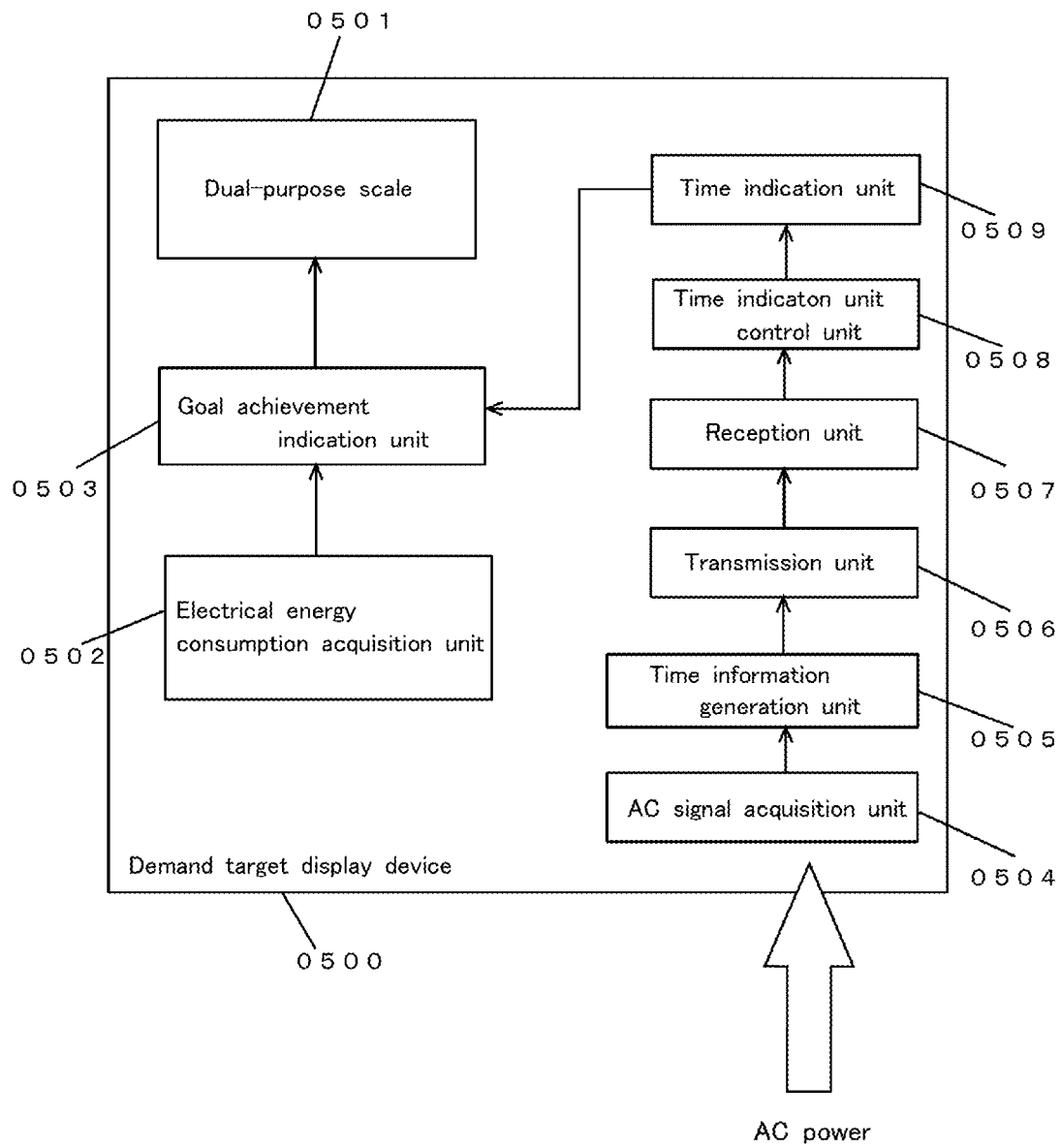
FIG. 5 is a diagram showing another example of functional block diagram of the demand target display device of the first embodiment.

FIG. 4 is a diagram showing an example of functional block diagram of the demand target display device of the first embodiment. As described in FIG. 4, the "demand target display device" (0400) of the first embodiment comprises a "dual-purpose scale" (0401), an "electrical energy consumption acquisition unit," (0402), a "goal achievement indication unit" (0403), an "AC signal acquisition unit," (0404), a "time information generation unit" (0405), a "transmission unit" (0406), a "reception unit" (0407), a "time indication unit control unit" (0408), and a "time indication unit" (0409). FIG. 4 shows the configuration by which the time indication unit directly serves its function for the dual-purpose scale. At the same time, FIG. 5 is a diagram showing another example of functional block diagram of the demand target display device of the first embodiment. As shown in FIG. 5, based on the presumption that the "time indication unit" (0509) is able to serve its function for the "goal achievement indication unit" (0503) and such function has been served, the goal achievement indication unit may be configured to serve its function for the "dual-purpose scale" (0501). Such configuration makes it possible to perform display control that allows the relationship between consumed electrical energy and target demand values within predetermined time segments to be more clearly viewable.

The "dual-purpose scale" is a scale for indicating the time and consumed electrical energy described below. That is to say, it is possible to indicate the time and electrical energy simultaneously via a single scale. In many cases, the location in which the dual-purpose scale is allocated can be the outer edge of the face for indicating the time of a timepiece, as shown in FIG. 3. However, such location is not particularly limited to that described above, provided that information on time and electrical energy can be displayed. The dual-purpose scale can indicate values based on a set of 60 marks representing 60 minutes, as is the case with scales of general timepieces used for clocking of time. Alternatively, it is possible to establish the number of marks as a multiple of 60 (e.g., 120) or as a divisor of 60 (e.g. 12).

The "time indication unit" retains a function for indicating the time via the dual-purpose scale. The outer marks on the dual-purpose scale are used to denote power consumption in relation to target demand value during a given time period. For example, the time segment including the current time is established as being 30 minutes long, from the beginning of an hour until 30 minutes after such beginning. Another segment of identical length then is established as beginning at the end of the first segment and continuing until the beginning of the following hour. In such case, the outer marks corresponding to the inner marks indicate the target demand value. For the each of the aforementioned time segments, the outer marks will be on the corresponding half of the scale. In addition, the time indication unit may also retain a function for indicating the current time via the dual-purpose scale.

The display of the starting or ending time of a segment for a given target demand value can be matched with the display of the current time when the current time is the starting or ending time of such segment. An example of a specific method for indication is a method in which the portion shown on the dual-purpose scale is illuminated by lighting equipment such as LEDs or light bulbs. An example of an illumination method is a method in which the light is maintained at a steady intensity until the end of a given time segment or a method in which the light continuously blinks or blinks at a predetermined time. Such illumination method is not particularly limited to the aforementioned methods, provided that the segment for a given target demand value including the current time can be visually recognized.

The "AC signal acquisition unit" retains a function for acquiring AC signals based on the AC waveform of AC power from a power supply line. The term "AC power from a power supply line" refers to a commercial power source provided by electric power companies to electric power consumers. Generally speaking, large fluctuations in the electricity supply-demand balance may result in changes in the commercial power source voltage provided by electric power companies. If voltage cannot be properly maintained, inaccurate operation of electrical equipment of electric power consumers or electric power transmission loss may occur disadvantageously. Therefore, in order to avoid the occurrence of disadvantages accompanying fluctuation of electricity supply-demand as stated above, electric power companies always implement control so as to minimize deviations in voltage and commercial power source frequency. Thus, the aforementioned "AC power from a power supply line" has a stable waveform due to the aforementioned control implemented by electric power companies. As described above, a configuration by which AC signals having stable waveforms are obtained makes it possible to know clocking of time in a stable and almost errorless manner with the use of such AC signals.

The "time information generation unit" retains a function for generating time information based on acquired AC signals. The expression "generating time information based on acquired AC signals" specifically refers to the process of using AC signals within certain cycles and synchronizing such cycles with the clocking of time. For example, the commercial power frequency currently used throughout the world is either 50 Hz or 60 Hz. Thus, the time information is generated in a manner such that it is synchronized with the aforementioned frequency cycles. That is to say, if the aforementioned commercial power frequency is 50 Hz, there are 50 cycles per second. If the aforementioned commercial power frequency is 60 Hz, there are 60 cycles per second. Time information is generated upon clocking of time under the aforementioned conditions.

As stated above, power frequency differs among counties and also among regions within the same country. For example, Japan uses both 50 Hz and 60 Hz. European countries use 50 Hz. The United States use 60 Hz. Therefore, a configuration by which time information is generated based on multiple different AC signals may be established for the time information generation unit. Such configuration makes it possible to provide accurate time information even in any environment anywhere in the world in which the situation for reception of standard time radio waves is not stable.

The "transmission unit" retains a function for transmitting the generated time information via radio waves within a housing. The expression "within a housing" means that the transmission unit is located within a housing of the demand target display device. A long-term clocking time for transmission of time information is not preferable. A short-term clocking time, such as every 1 second, is desirable. For example, 5 seconds is acceptable. As long as such time allows the time indication unit control unit described below to perform control based on accurate information, such time can be arbitrarily established.

The "reception unit" retains a function for receiving the transmitted time information via radio waves within the housing. The expression "receiving . . . within the housing" specifically refers to a situation in which the aforementioned time information transmitted via radio waves within the housing is received within the same housing of the demand target display device. A configuration by which the transmission unit and the reception unit are established in relatively close proximity to each other does not require a high level of field strength for radio waves. Such configuration also does not require conformance with legal regulations, etc. under which licenses or the like are required upon transmission of radio waves with field strength of a certain degree or higher.

In addition to the effects described above, the reception unit and the transmission unit are established as separate constituent features. Thereby, it is possible to alter the mechanism of an existing electric wave timepiece, etc. of conventional technology. That is to say, a conventional electric wave timepiece includes a reception unit for receiving standard time radio waves from an external source. The transmission unit, the time information generation unit, and the AC signal acquisition unit can be established for an electric wave timepiece with the aforementioned mechanism. Such configuration makes it possible to configure the demand target display device of the first embodiment. In such case, the reception unit is configured to receive time information transmitted from the transmission unit in lieu of standard time radio waves. Thereupon, the transmission unit and the reception unit are configured to exist in remarkably close proximity within the same housing of the demand target display device. In general, the information from a transmission unit is transmitted to a reception unit over a relatively long distance. With the device of the present invention, it is possible to receive information in preference to standard time radio waves, which are subjected to a certain amount of damping in free space, At any case, this configuration makes it possible to resolve issues posed by the corresponding conventional technology while maintaining and using such technology for an electric wave timepiece.

The "time indication unit control unit" retains a function for controlling the time indication unit via the received time information. The expression "controlling the time indication unit via the received time information" specifically refers to a situation in which the received specific time information is processed as it is by the time indication unit. An example of a segment for a given target demand value explained above is used. In such case, in case that the received information is information that indicates arrival of 10:30, it is possible to perform controlling so that such information can be visually recognized by viewing the blinking of the corresponding portion on a dual-purpose scale or the like. Furthermore, a function for controlling that allows display of the current time via a minute hand, etc. of a timepiece within the dual-purpose scale or the outside the demand target display device may be included. As described above, the configuration by which the same time as that used by an electric power company is indicated makes it possible to avoid a situation in which a difference in recognition regarding consumed electrical energy occurs between the electric power company and electric power consumers. Additionally, the aforementioned configurations make it possible to visually recognize the current time and the degree of target achievement in an integrated manner using only the demand target display device of the first embodiment or based on the combined use of such device and a timepiece in any environment in which electricity can be used.

The "electrical energy consumption acquisition unit" retains a function for acquiring electrical energy consumed up to the current time within a given segment for a given target demand value including the current time. The term "target demand value" refers to an electrical energy value that is a targeted upper limit for consumption within a predetermined time segment. A specific method for determining a target upper limit is to establish a predetermined value selected from among amounts of consumed electrical energy. Such value is identified as a reference value upon computation of basic charges by electric power companies, as described above. As an example, integral energy consumption within a period of 30 minutes does not exceed 60 kWh. If this is established as a target, it is possible for the target demand value to be 60 kWh.

A configuration is possible by which information on electrical energy consumption is obtained via a wired or wireless communication line from an electrical consumption meter installed for a power supply line. A single basic power supply line for a single building is acceptable. If power supply lines for all pieces of electric equipment for a single room or for all of the rooms of a single building are provided, categorization of targeted electric equipment acquiring information on consumed electrical energy is possible. In this way, it is possible to monitor electricity consumption in detail. For example, in case that power consumption is obtained from power supply lines connected to an outlet unit, each single piece of electrical equipment can be a target of monitoring. In such case, it is convenient to allocate watt checkers for all outlets, to use a form of Power Line Communication (PLC), and to acquire information on consumed electrical energy for all pieces of electric equipment. The various configurations by which information on consumed electrical energy is obtained make it possible to categorize targeted electric equipment that consumes electrical energy. Thereby, it is possible to establish target demand values based on building, office within a building, or unit of electric equipment, and to indicate the degree of achievement of such target demand values. In such case, the amount of consumed electrical energy indicated on a dual-purpose scale can be identified for each room or each piece of electric equipment. For example, it is acceptable to indicate rooms in which electricity consumption takes place and/or equipment that consumes electricity via color, sound, or character display function.

The term "electrical energy consumed up to the current time within a given segment for a given target demand value including the current time" refers to electrical energy consumption characterized by the following example. The current time is 10:23. The time segment including the current time is established as being 30 minutes long, from the beginning of an hour until 30 minutes after such beginning.

Another segment of identical length then is established as beginning at the end of the first segment and continuing until the beginning of the following hour. In such case, the outer marks corresponding to the inner marks indicate the target demand value. For the each of the aforementioned time segments, the outer marks will be on the corresponding half of the scale. The aforementioned term refers to the electrical energy consumption during the 23 minutes from 10:00 as the starting time of the relevant time segment until the current time.

Moreover, in order to resolve the problems with the conventional technology described above, the aforementioned given segment for a given target demand value must have the same (or a lesser) duration and start at the same time as the time segment used as a basis of computation by the relevant electric power company for computation of electric charges explained earlier. And such time segment must also satisfy the condition that at least some portion thereof overlaps with the time segment used by the relevant electric power company for as a basis of computation and is at least as long as a period with a time length value that is a common divisor of the time length value of the aforementioned time segment. That is to say, when electric power consumers undertake energy-saving actions so that consumed electrical energy does not exceed target demand values, demand values that are the basis for computation of basic charges selected from among electric charges will be lowered. As a result, it will be possible to lower electric charges over the long term. The segment for a given target demand value currently in use among electric power companies in Japan is 30 minutes. Thus, it is possible to establish a given segment for a given target demand value as 30 minutes or to establish the aforementioned time segment as 15 minutes in order to formulate more detailed energy-saving action plans. However, the aforementioned time segments have been determined by electric power consumers. Thus, it can be assumed that they could change the duration of the aforementioned time segments in the future. Thus, a segment for a target demand value is not limited to 30 minutes, and 15 minutes or 60 minutes are acceptable. A configuration that can be set to different values is desirable.

The "goal achievement indication unit" retains a function for indicating the relationship between electrical energy consumption within a given segment recorded via the electrical energy consumption acquisition unit and a target demand value set for such segment." Various methods for "indicating the relationship between electrical energy consumption within a given segment recorded via the electrical energy consumption acquisition unit and a target demand value set for such segment" can be conceived. For example, target average power consumption, which is the speed of electricity consumption upon consumption of electrical energy corresponding to a target demand value during a segment for such target demand value, and target electrical energy consumption at relevant times are assumed. It is possible to indicate the percentage of electrical energy consumption that has been consumed up to the current time to target electrical energy consumption within a given segment for a given target demand value in a visually recognizable manner using the relative location of a minute hand to a light emitting member or members. That is to say, it is possible to employ a method for indicating the percentage of electrical energy actually consumed up to the relevant time to target electrical energy consumption on the dual-purpose scale using the positioning of light emitting members, such as LEDs and light bulbs, relative to the location of a minute hand.

Figure 6:
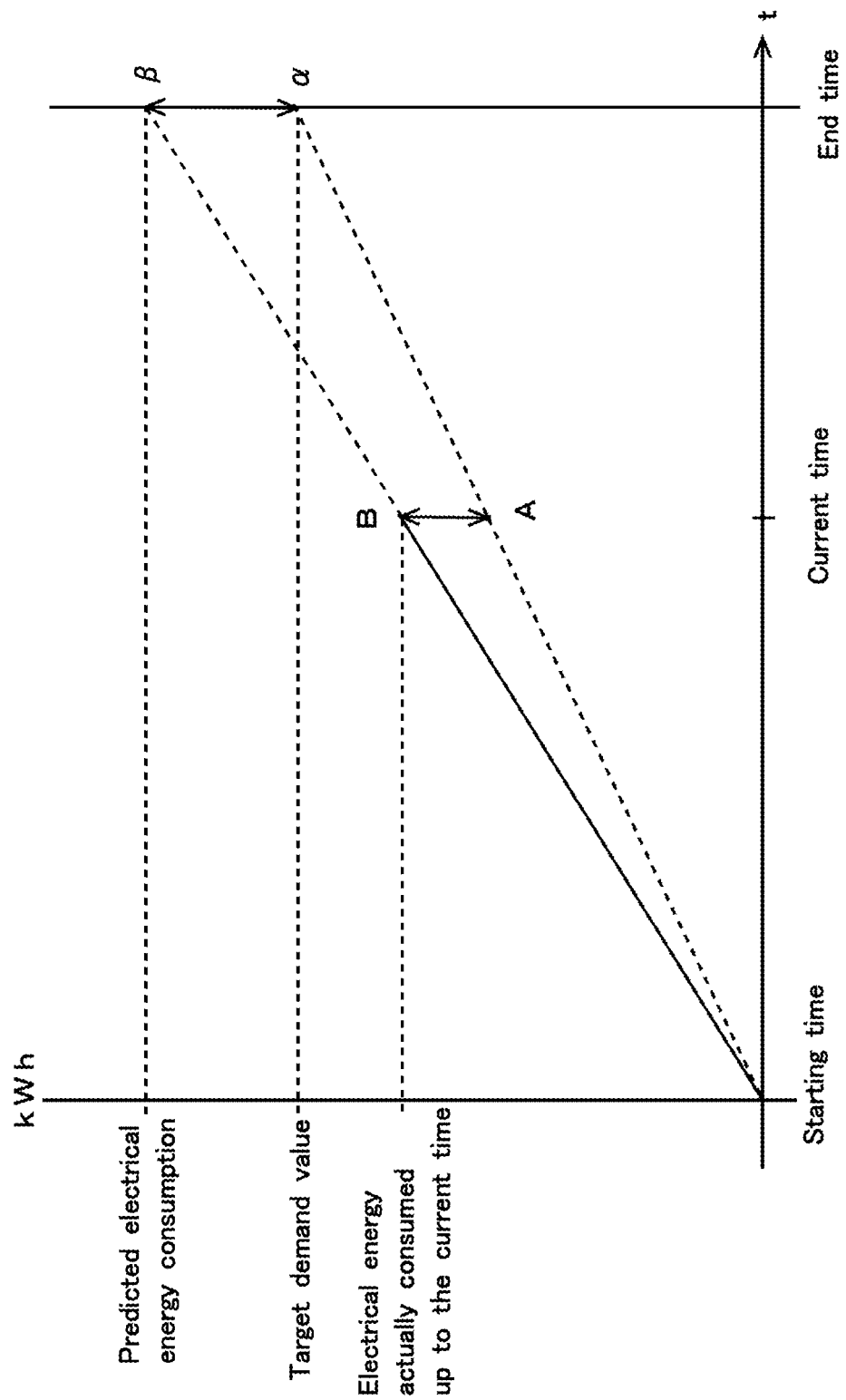
FIG. 6 is a diagram showing an example of progression of the process of measurement conducted via a goal achievement indication unit of the demand target display device of the first embodiment.

FIG. 6 is a diagram showing an example of a specific method for computation of electrical energy consumption during a period from the starting time of a given segment for a given target demand value until the end time thereof. In FIG. 6, "α" represents a target demand value, and "A" represents a target electrical energy consumption at a time indicated by a minute hand. "B" represents electrical energy actually consumed up to the aforementioned time. A specific function of the goal achievement indication unit is to indicate the percentage of B to A, as shown in FIG. 6 using the location of a minute hand relative to a light emitting member or members on the dual-purpose scale. Specifically, in FIG. 6, B exceeds A. Thus, it is possible to indicate a location beyond the location of a minute hand in a luminescent manner.

Figure 7:
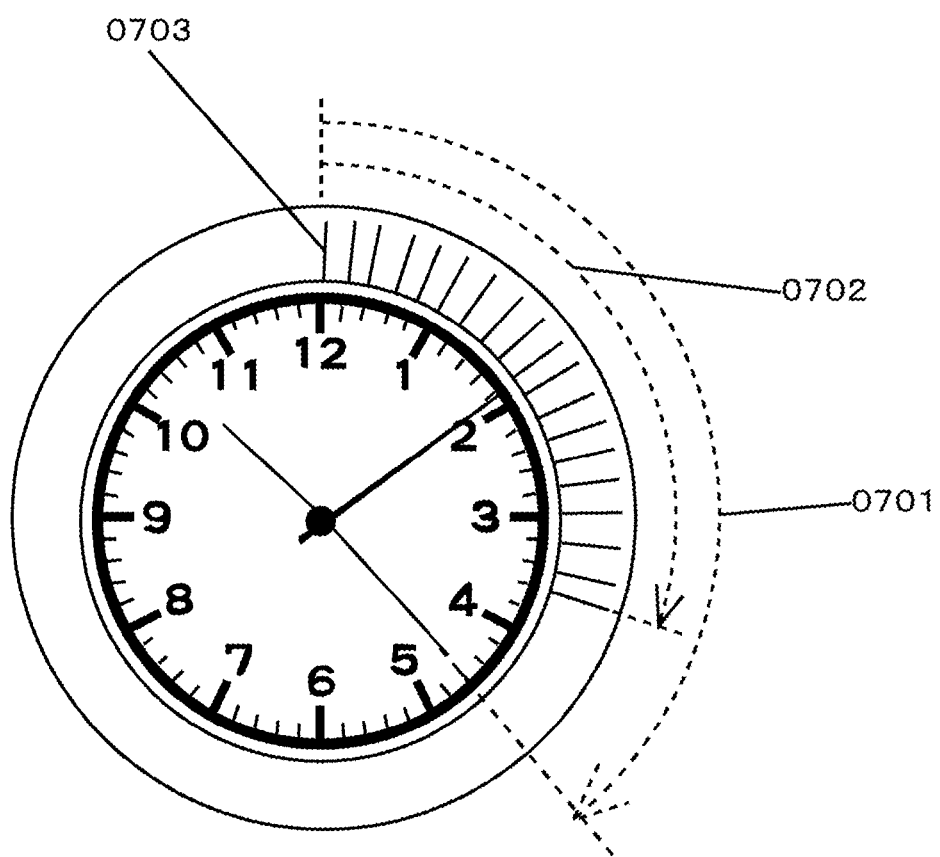
FIG. 7 is a diagram showing an example of indication that takes place via the goal achievement indication unit of the demand target display device of the first embodiment and a fifth embodiment.

FIG. 7 is a diagram showing an example of a display of the goal achievement indication unit that uses rod-shaped marks. In the same manner as that of an example previously used, a given segment for a given target demand value is established as being 30 minutes long, from the beginning of an hour until 30 minutes after such beginning. Another segment of identical length then is established as beginning at the end of the first segment and continuing until the beginning of the following hour. FIG. 7 is a diagram showing an example of indication at the time of 10:23. In FIG. 7, an "outer mark at a position corresponding to the inner mark denoting the beginning of each hour" (0703) on the dual-purpose scale represents a starting point. Rod-shaped marks are sequentially disposed starting from the starting point described above to the "outer mark at a position corresponding to the inner mark denoting 18 minutes past the hour" (i.e., a location corresponding to 60% of the entire segment for a given target demand value) (0702). The aforementioned indication makes it possible to visually recognize that electrical energy equivalent to 60% of the target demand value established at the current time has been consumed.

It is acceptable to configure the goal achievement indication unit so that such unit retains a function for always determining whether the value of electrical energy consumption at the current time, which has been obtained via the electrical energy consumption acquisition unit, exceeds a target demand value. The expression "always determining" refers to a situation in which determination takes place over a shorter period of time than the relevant time segment. For example, in case that a length of time segment is 30 minutes, determination takes place on a 30-second or 1-minute period basis. In case that a length of a time segment is 2 hours, determination takes place on a 5-minute period basis. The goal achievement indication unit determines "whether the value of electrical energy consumption at the end of a segment exceeds a target demand value." Furthermore, it is acceptable to configure such unit so that it determines the degree of excess or leeway. For example, it is possible to compute on percentage basis whether or not the predicted electrical energy consumption described above exceeds or falls short of the target demand value within a relevant time segment. (This will be explained in detail in a fifth embodiment.)

An example of a method for indicating the aforementioned relationship is described below. In case that electrical energy consumption at a certain time exceeds a target demand value at such time, warning by means of characters, colors, images, or the like on a display of the device can be given. Alternatively, a warning tone can be given. On the other hand, in case that electrical energy consumption does not exceed a target demand value, it is possible to indicate that there is leeway using the same variety of means as those stated above. Moreover, it is also acceptable to configure a plurality of phases so that they are established based on the degree of difference between the aforementioned electrical energy consumption and the target demand value, following which indication representing different types of information takes place. For example, the following methods for indication using different colors is possible. In case that the difference is of a positive nature (that is, if electrical energy consumption exceeds a target demand value), a method for indication in red is possible. In case that there is no difference, a method for indication in green is possible. And in case that the difference is of a negative nature (that is, if electrical energy consumption is less than a target demand value), a method for indication in blue is possible.

It is possible to store the target demand value information used for the electrical energy consumption acquisition unit and the goal achievement indication unit in an internal storage unit in advance. It is also possible for the aforementioned information to be obtained from external devices via communication lines, such as via a wired or wireless communication line or a PLC. Moreover, it is also possible to accept operation inputs via an operation input apparatus and to obtain the aforementioned information via a storage unit, such as a USB memory. It is assumed that electricity consumption exactly equivalent to the target demand value takes place during a given segment for a given target demand value. In case that average electricity consumption takes place within such time segment, the relationship between electrical energy value to be consumed up to the current time and electrical energy actually consumed up to the current time (i.e., the value acquired via the electrical energy consumption acquisition unit) corresponds to the "relationship between electrical energy consumption within a given segment recorded via the electrical energy consumption acquisition unit and a target demand value set for such segment."

Specific Configuration of Demand Target Display Device

Figure 8:
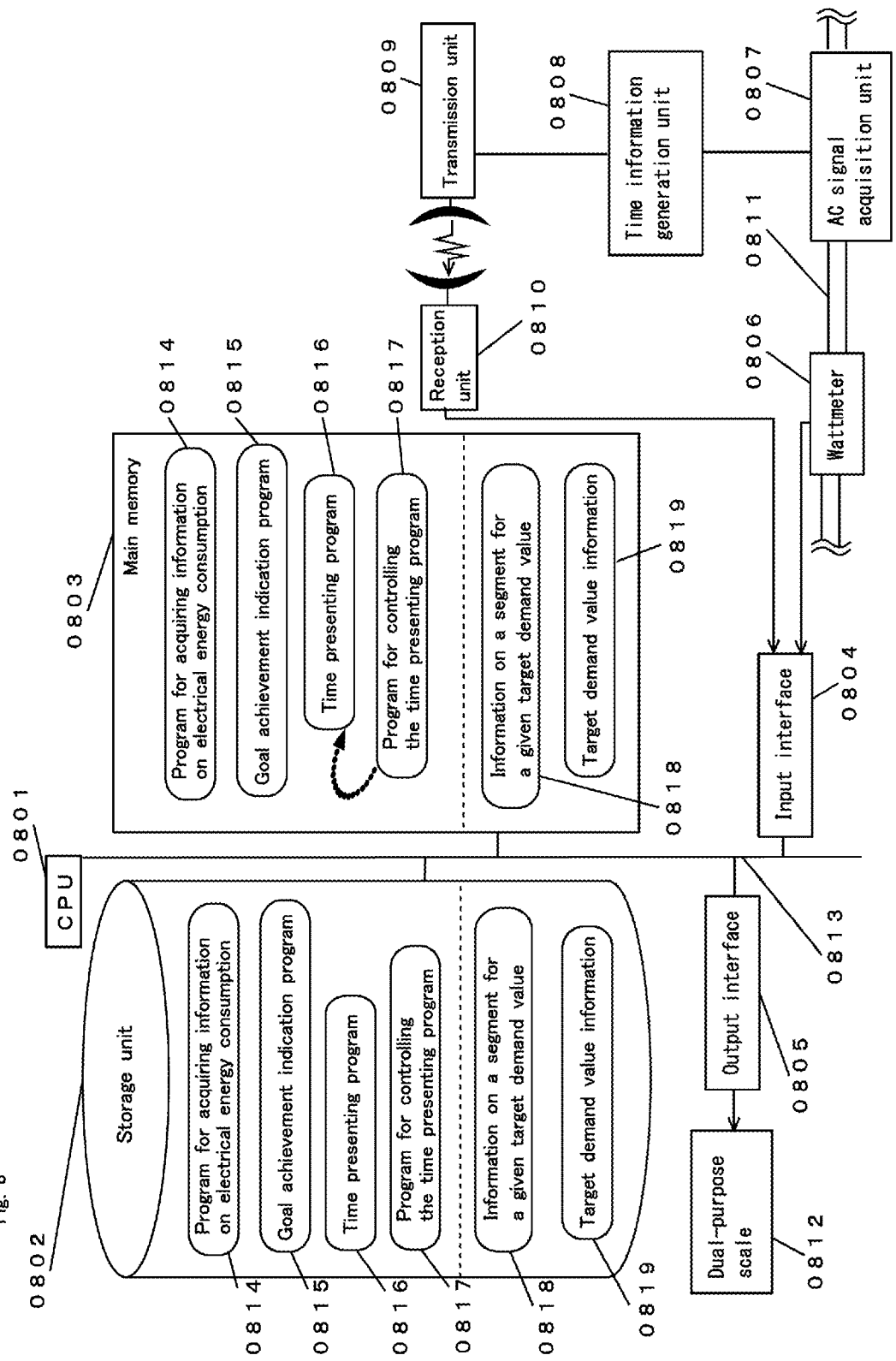
FIG. 8 is a schematic diagram showing an example of a functional hardware configuration units of the demand target display device of the first embodiment.

FIG. 8 is a schematic diagram showing an example of a functional hardware configuration unit of the demand target display device of the first embodiment. Operations for hardware configuration units are explained hereinafter with reference to FIG. 8.

As shown in FIG. 8, the demand target display device comprises a "CPU" (0801), a "storage unit (storage medium)" (0802), a "main memory" (0803), an "input interface" (0804), and an "output interface" (0805). The input interface receives signals relating to electrical energy consumption from a "wattmeter" (0806) sensing electrical energy flowing through a "power supply line." (0811). In addition, the input interface also receives the time information generated after it goes through an "AC signal acquisition unit" (0807) and a "time information generation unit" (0808) via a "transmission unit" (0809) and a "reception unit" (0810). Additionally, the output interface transmits signals for indicating "time presenting information" (a graphical representation is omitted) on a "dual-purpose scale" (0812). In addition, various programs that will be explained in detail hereinafter are stored in the storage unit. CPU first develops such programs in the main memory and executes the same. The aforementioned configuration is mutually connected by a "system bus" (0813) as a data communication path, and transmission, reception, and processing of information take place.

Specific Processing via Electrical Energy Consumption Acquisition Unit

The CPU executes a "program for acquiring information on electrical energy consumption" (0814), acquires the information on electrical energy consumption obtained through power consumption integration processing via the wattmeter sensing electrical energy flown through the power supply line via the input interface, and stores the results of the corresponding process in the predetermined address of the main memory.

Specific Processing via Goal Achievement Indication Unit

The CPU loads "target demand value information" (0819) stored in the main memory in advance and the information obtained through execution of the program for acquiring information on electrical energy consumption, executes a "goal achievement indication program" (0815), computes electrical energy consumption realized for demand target achievement at the current time, and indicates the relationship between the results of such processing and the information on electrical energy consumption at the current time.

Specific Processing via Time Indication Unit and Time Indication Unit Control Unit The CPU loads the information on a given segment for a given target demand value, executes a "time presenting program" (0816), undertakes processing for presenting the time as a start or an end point of the segment for a given target demand value on the dual-purpose scale, and stores the results thereof in the predetermined address of the main memory. The CPU also executes a "program for controlling the time presenting program" (0817), loads the time information (a graphical representation is omitted) obtained via the reception unit, and undertakes processing for controlling the time presenting program such that the time as a start or an end point of the segment for a given target demand value is indicated on the dual-purpose scale based on the corresponding time information.

Processing Flow of First Embodiment

Figure 9:
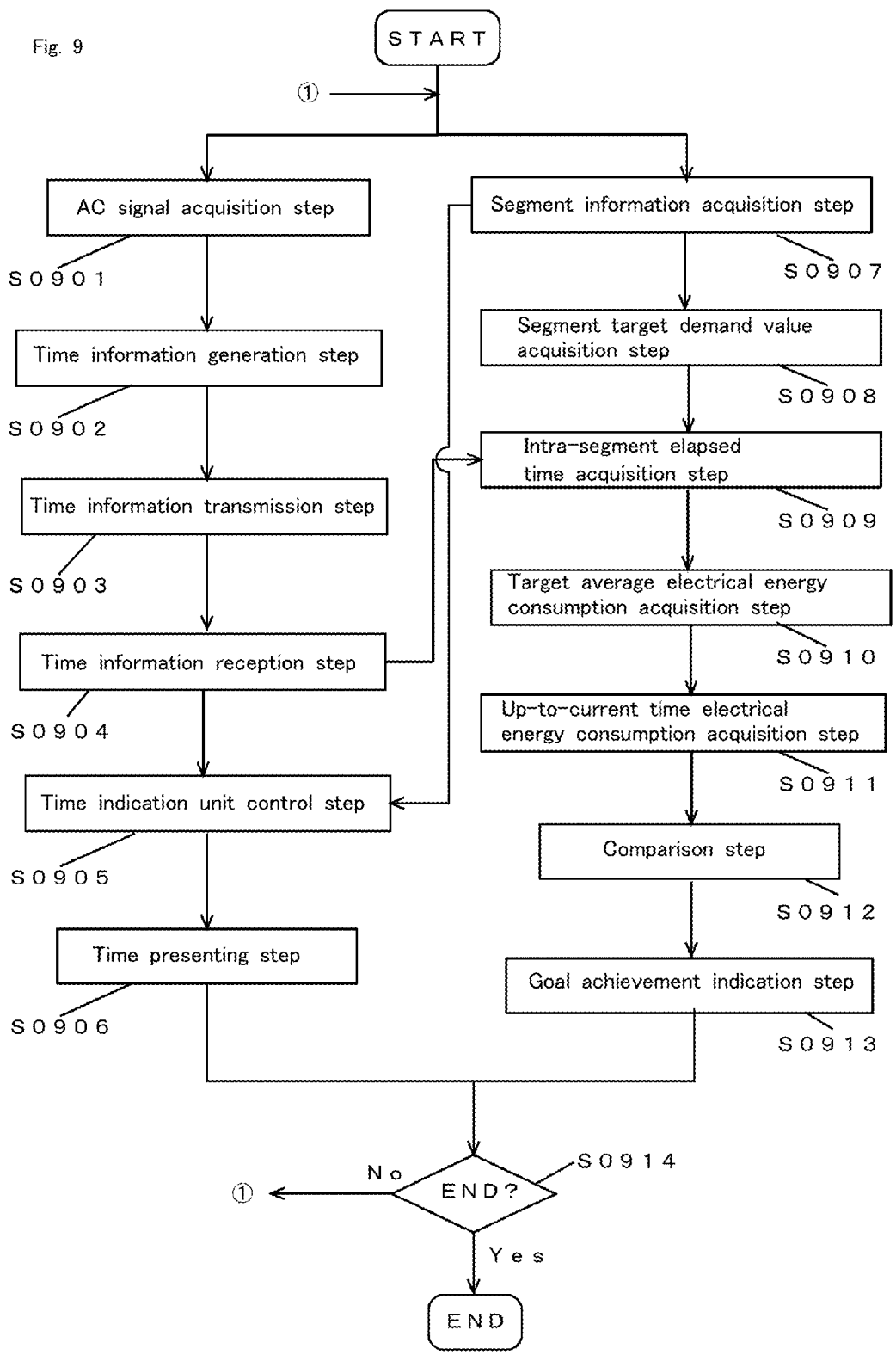
FIG. 9 is a diagram showing an example of progression of the process of the demand target display device of the first embodiment.

FIG. 9 is a diagram showing an example of progression of the process of the demand target display device of the first embodiment. The processing flow of FIG. 9 comprises the following steps. Initially, AC signals based on the AC waveform of AC power from a power supply line is obtained (S0901: AC signal acquisition step). Next, time information based on the acquired AC signals is generated (S0902: time information generation step). The generated time information is transmitted via radio waves (S0903: time information transmission step). Subsequently, the aforementioned time information is received within a housing (S0904: time information reception step). The time indication unit is controlled based on segment information acquired via a segment information acquisition step noted below and the aforementioned time information received via the time information reception step (S0905: time indication unit control step). Time is indicated on the dual-purpose scale based on the information controlled via the time indication unit control step (S0906: time presenting step).

The information relating to a given time segment is obtained (S0907: segment information acquisition step). A segment target demand value determined based on the segment information acquired above is obtained (S0908: segment target demand value acquisition step). Furthermore, the information on the time elapsed within the aforementioned segment is acquired based on the time information generated via the time information generation step, for example (S0909: intra-segment elapsed time acquisition step). Target average electrical energy consumption in a percent form corresponding to the intra-segment elapsed time acquired above in relation to the entire segment is computed (S0910: target average electrical energy consumption acquisition step). Information is obtained on electrical energy consumption from the aforementioned segment commencement until the current time (S0911: up-to-current time electrical energy consumption acquisition step). Subsequently, the aforementioned target average electrical energy consumption and the aforementioned up-to-current time electrical energy consumption are compared (S0912: comparison step). Based on the result of the processing via the comparison step, the degree of goal achievement is indicated on the dual-purpose scale (S0913: goal achievement indication step).

After the time presenting step and the goal achievement indication step have been undertaken, it is determined via the step 0914 whether or not the subsequent processing should be undertaken. In case that it is determined that the subsequent processing should be undertaken, processing after the step 0901 and the step 0907 is undertaken. In case that it is determined that the subsequent processing should not be undertaken, the processing is completed.

In regard to the order of priority of the steps noted above, the steps after the steps 0901 and 0907 are separately processed. For example, even if either type of processing is not completely finished, the other type of processing can be commenced. The aforementioned steps constitute an example. The order of priority for the processing for the step 0910 and the step 0911 may be reversed. (The same applies to processing flow explanations of embodiments below.)

Brief Description of Effects of First Embodiment

When electric power consumers look at the demand target display device of the first embodiment with the aforementioned characteristics, it is possible for such consumers to understand the degree of target achievement of actual demand values with the same level of awareness as electric power companies anywhere from which they are able to receive a supply of electrical energy.

Second Embodiment

Concept of Second Embodiment

A demand target display device of a second embodiment is basically the same as that of the first embodiment. The demand target display device of the second embodiment is characterized in that electromagnetic shielding applies to radio waves transmitted from the transmission unit by and/or within a housing so that such radio waves will not leak outside the housing. The configuration noted above makes it possible to avoid a situation in which radio waves containing time information are leaked outside the device, and as a result, and other electric equipment or the like is impacted. Furthermore, such configuration also makes it possible to avoid a situation in which various radio waves existing outside the device and radio waves containing time information interfere with each other, and, as a result, the device will not be able to accurately receive time information used to determine a start or an end point of a segment for a given target demand value.

Functional Configuration of Second Embodiment

Figure 10:
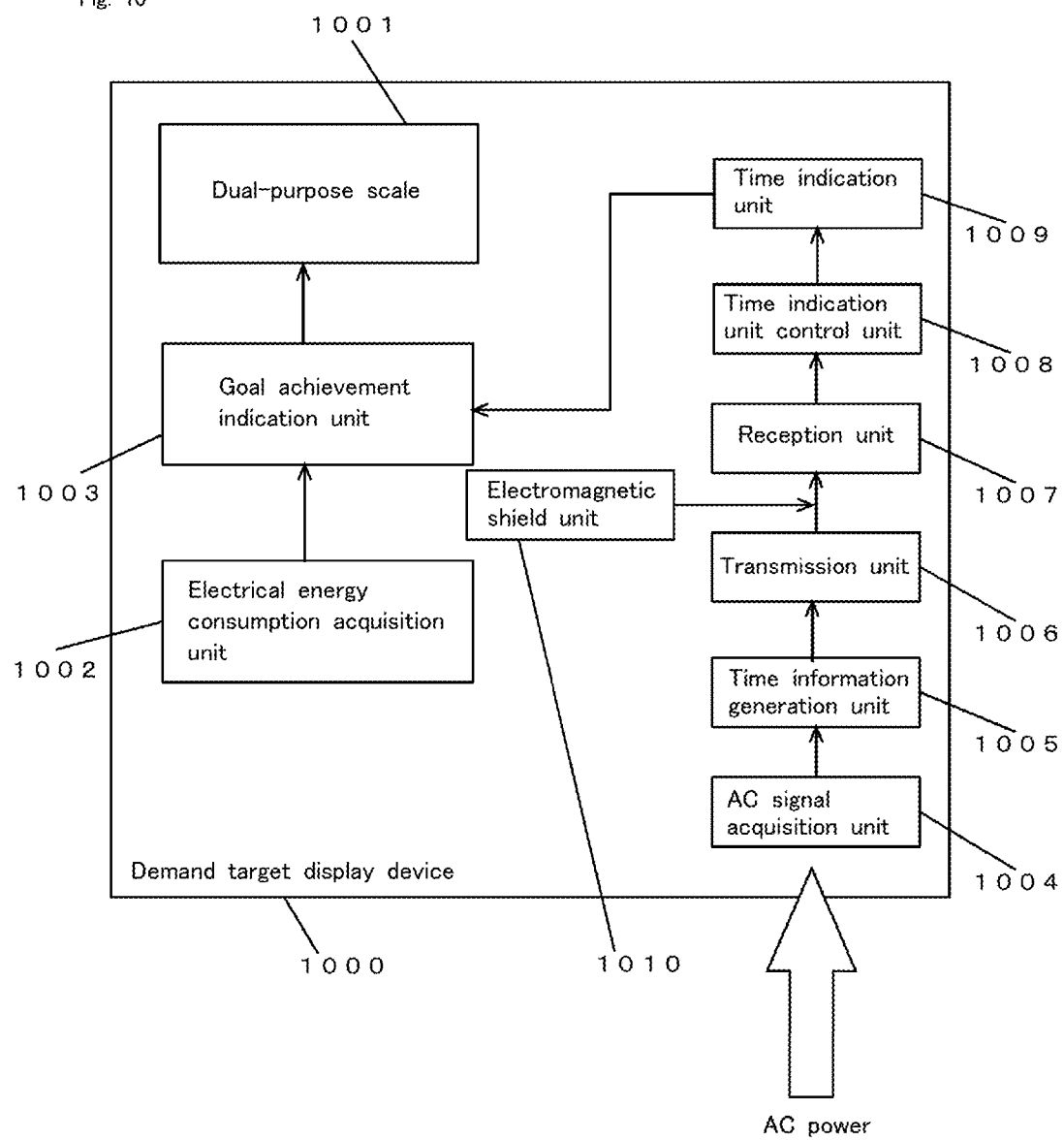
FIG. 10 is a diagram showing an example of functional block diagram of a demand target display device of a second embodiment.

FIG. 10 is a diagram showing an example of functional block diagram of a demand target display device of a second embodiment. As shown in FIG. 10, the demand target display device of the second embodiment device comprises a "dual-purpose scale" (1001), an "electrical energy consumption acquisition unit" (1002), a "goal achievement indication unit" (1003), an "AC signal acquisition unit" (1004), a "time information generation unit" (1005), a "transmission unit" (1006), a "reception unit" (1007), a "time indication unit control unit" (1008), a "time indication unit" (1009), and an "electromagnetic shield unit" (1010). Explanations of the demand target display device, which are not included in the explanations of the demand target display device of the FIG. 4 of the first embodiment or the like, are provided with a central focus on the electromagnetic shield unit hereinafter.

The "electromagnetic shield unit" retains a function for electromagnetic shielding of radio waves transmitted from the transmission unit within a housing so that such radio waves will not leak outside the housing. The expression "electromagnetic shielding of radio waves transmitted from the transmission unit within a housing" specially refers to a situation in which shielding of at least the transmission unit and the reception unit can prevent unnecessary radio waves from entering from other portions and/or prevent leakage of radio waves to other portions. An example of a specific method for electromagnetic shielding is to shield the transmission unit and the reception unit via punching metal processing using metallic foils, such as copper foil and aluminum foil, or using metallic materials, such as galvanized steel sheeting and aluminum.

In order to generate the same effect as that of the aforementioned functions, the electromagnetic shield unit can be established within a housing. In addition, it is acceptable to configure the housing such that it serves an electromagnetic shield function. Moreover, it is acceptable to use both a housing with the function for electromagnetic shield and an electromagnetic shield unit. The aforementioned configuration makes it possible to prevent leakage of radio waves transmitted from the transmission unit outside the housing. Such configuration also prevents radio waves dispatched from outside the housing from entering into the housing and from being received via the reception unit.

Specific Configuration of Demand Target Display Device

The specific configuration for the demand target display device of the second embodiment is basically the same as that explained in the first embodiment.

Processing Flow of Second Embodiment

Processing flow for the demand target display device of the second embodiment is basically the same as that explained in the first embodiment.

Brief Description of Effects of Second Embodiment

The demand target display device of the second embodiment makes it possible to avoid a situation in which radio waves containing time information will leak outside the device and certain impact will be caused to other electric equipment, and the like. Furthermore, the demand target display device also makes it possible to avoid a situation in which various radio waves existing outside the device and radio waves containing time information interfere with each other, and, as a result, the device will not be able to accurately receive time information used to determine a start or an end point of a segment for a given target demand value.

Third Embodiment

Concept of Third Embodiment

A demand target display device of a third embodiment is basically the same as that of the first or the second embodiment. Such demand target display device is characterized by comprising an external time information acquisition unit that receives standard time radio waves and outputs time information to a time information generation unit. Such configuration makes it possible to avoid a situation in which the time presenting function or the function for goal achievement indication would be completely lost, even in an environment in which electric energy supply has been suspended upon blackout, etc.

Functional Configuration of Third Embodiment

Figure 11:
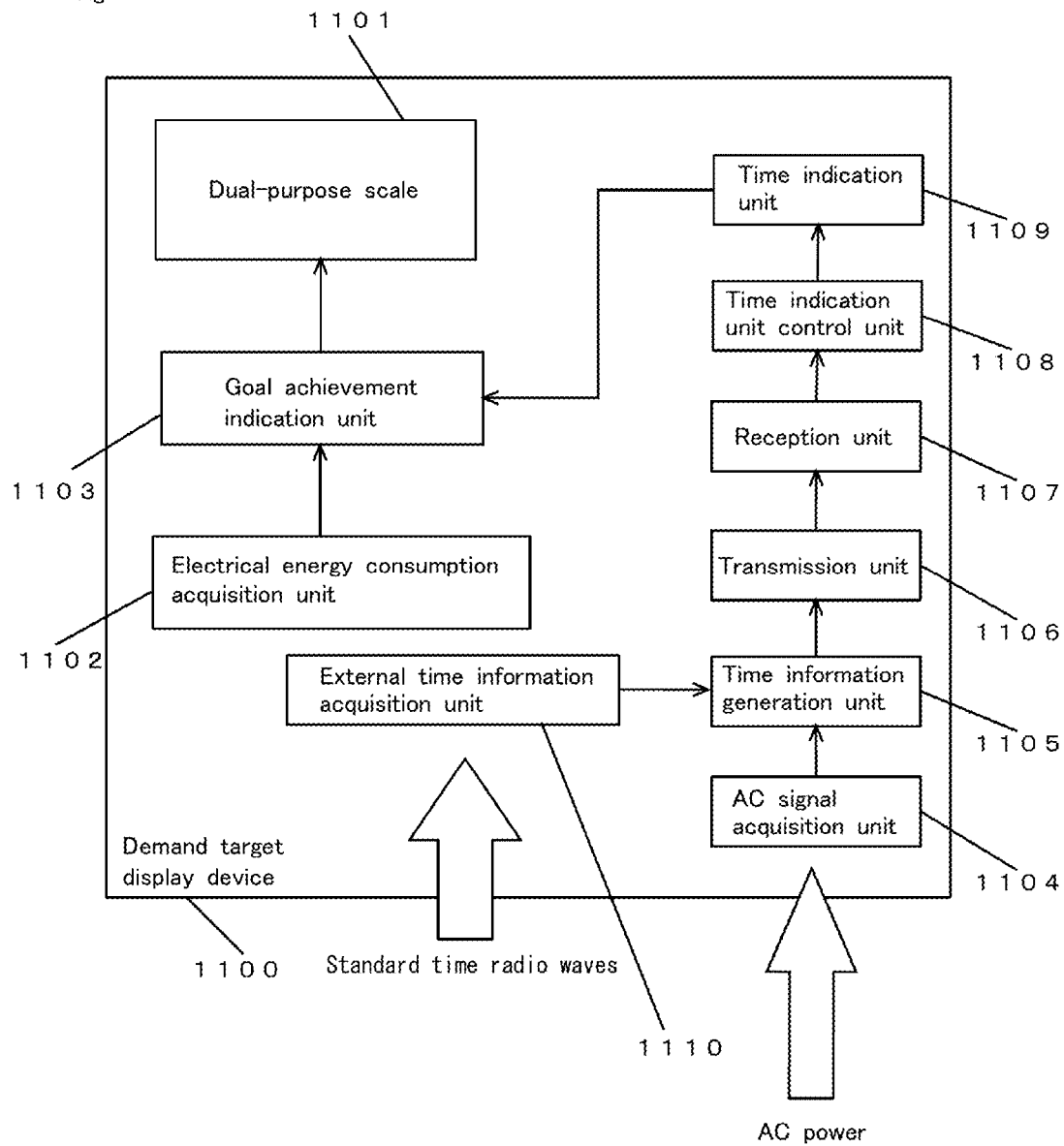
FIG. 11 is a diagram showing an example of functional block diagram of a demand target display device of a third embodiment.

FIG. 11 is a diagram showing an example of functional block diagram of a demand target display device of a third embodiment. As described in FIG. 11, the "demand target display device" of the first embodiment comprises a "dual-purpose scale" (1101), an "electrical energy consumption acquisition unit," (1102), a "goal achievement indication unit" (1103), an "AC signal acquisition unit," (1104), a "time information generation unit" (1105), a "transmission unit" (1106), a "reception unit" (1107), a "time indication unit control unit" (1108), a "time indication unit" (1109), and an "external time information acquisition unit" (1110). Explanations of the demand target display device of the third embodiment, which are not included in the explanations of the demand target display device of the FIG. 4 of the first embodiment or the like, are provided with a central focus on the external time information acquisition unit hereinafter.

The "external time information acquisition unit" retains a function for receiving standard time radio waves and outputting time information to the time information generation unit. The term "standard time radio waves" refers to radio waves dispatched based on an atomic timepiece in order to transmit time information as standardized information for relevant countries around the world. The configuration of the first or the second embodiment in which AC signals are acquired based on the AC waveform of AC power from a power supply line as described above makes it possible to accurately receive standardized time. However, it is difficult to acquire time information using electric energy in a case in which the supply of electric energy is suspended due to a blackout, etc. The configuration by which the external time information acquisition unit is established makes it possible to accurately indicate the information on the time as a start or an end point of the segment for a given target demand value through reception of standard time radio waves, even in case it has become temporarily difficult to receive electric energy as described above.

In addition, consumable electric energy does not exist in a situation in which electric energy temporarily cannot be supplied, such as the example of a blackout noted above (i.e., when electrical energy consumption is zero). It still remains important to visually recognize the degree of target achievement in relation to a given segment for a given target demand value. Thus, the aforementioned configuration by which goal achievement indication can be visually recognized (including during a period of non-supply of electric energy) is remarkably useful for demand target management.

The external time information acquisition unit and the AC signal acquisition unit retain the same function for transmitting signals as bases for generation of time information to the time information generation unit. Therefore, the time information generation unit of the third embodiment can be configured to select either the acquired AC signals or the time information acquired via the external time information acquisition unit and to generate time information based on either thereof. However, in terms of demand management, it is desirable to generate time information based on AC signals, as is the case with electric power companies. Thus, time information should be normally generated from AC signals acquired via the AC signal acquisition unit. A configuration by which time information is generated upon blackout only in a supplementary manner using information obtained via the external time information acquisition unit is desirable.

Specific Configuration of Demand Target Display Device

The specific configuration for the demand target display device of the third embodiment is basically the same as that explained in the first embodiment with reference to FIG. 8. Explanations of the demand target display device of the third embodiment, which are not included in the explanations of the demand target display device of the FIG. 8 of the first embodiment, are provided with a central focus on specific processing of external time information acquisition unit hereinafter.

Specific Processing via External Time Information Acquisition Unit

The CPU executes an external time information acquisition program, receives standard time radio waves transmitted from outside the housing, obtains time information via such radio waves, and stores the results thereof in the predetermined address of the main memory.

Processing Flow of Third Embodiment

Figure 12:
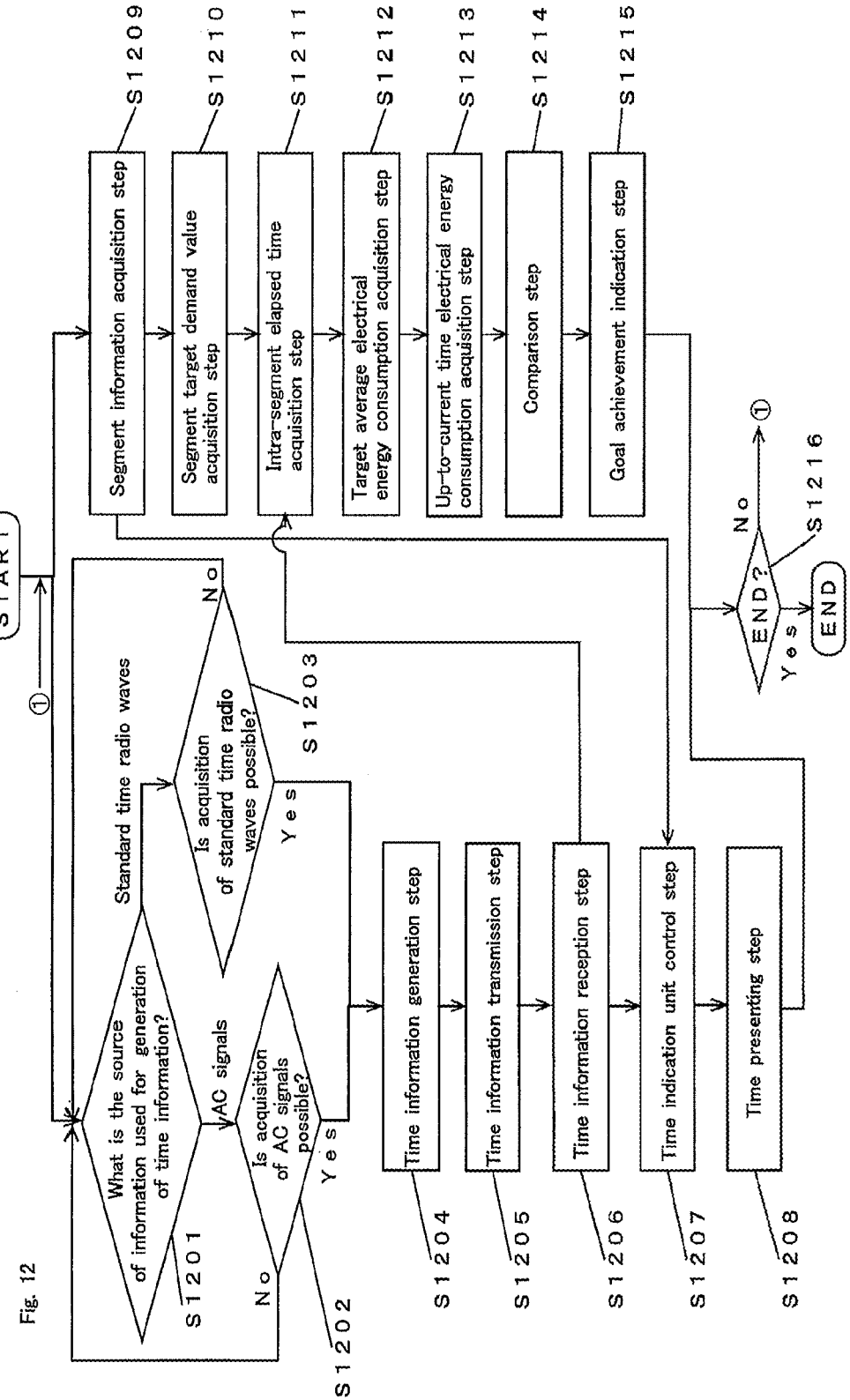
FIG. 12 is a diagram showing an example of progression of the process of a demand target display device of the third embodiment.

FIG. 12 is a diagram showing an example of progression of the process of a demand target display device of the third embodiment. The processing flow of FIG. 12 comprises the following steps. Initially, it is determined whether or not the source of information used for generation of time information via the time information generation step is AC signals or standard time radio waves (step 1201). In case that it has been determined that the source of information used for generation of time information via the time information generation step is AC signals, the processing moves on to the step 1202. In case that it has been determined that the source of information used for generation of time information via the time information generation step is standard time radio waves, the processing moves on to the step 1203. It is determined whether or not acquisition of AC signals is possible (S1202). In case that it is determined that acquisition of AC signals is possible, AC signals are obtained and the processing moves on to the step 1204. In case that it is determined that acquisition of AC signals is not possible due to blackout etc., the processing returns to the step 1201. It is determined whether or not acquisition of standard time radio waves is possible (S1203). In case that it is determined that acquisition of standard time radio waves is possible, information on standard time radio waves is obtained and the processing moves on to the step 1204. In case that it is determined that acquisition of standard time radio waves is not possible, the processing returns to the step 1201.

Based on the results of processing of the step 1202 or step 1203 as described above, Time information based on the acquired AC signals is generated (S1204: time information generation step). The generated time information is transmitted via radio waves (S1205: time information transmission step). Subsequently, the aforementioned time information is received within a housing (S1206: time information reception step). The time indication unit is controlled based on segment information acquired via a segment information acquisition step noted below and the aforementioned time information received via the time information reception step (S1207: time indication unit control step). Time is indicated on the dual-purpose scale based on the information controlled via the time indication unit control step (S1208: time presenting step).

The information relating to a given time segment is obtained (S1209: segment information acquisition step). A segment target demand value determined based on the segment information acquired above is obtained (S1210:

segment target demand value acquisition step). Furthermore, the information on the time elapsed within the aforementioned segment is acquired based on the time information generated via the time information acquisition step, for example (S1211: intra-segment elapsed time acquisition step). Target average electrical energy consumption in a percent form corresponding to the intra-segment elapsed time acquired above in relation to the entire segment is computed (S1212: target average electrical energy consumption acquisition step). Information is obtained on electrical energy consumption from the aforementioned segment commencement until the current time (S1213: up-to-current time electrical energy consumption acquisition step). Subsequently, the aforementioned target average electrical energy consumption and the aforementioned up-to-current time electrical energy consumption are compared (S1214: comparison step). Based on the result of the processing via the comparison step, the degree of goal achievement is indicated on the dual-purpose scale (S1215: goal achievement indication step).

After the time presenting step and the goal achievement indication step have been undertaken, it is determined via the step 1216 whether or not the subsequent processing should be undertaken. In case that it is determined that the subsequent processing should be undertaken, processing after the step 1201 and the step 1209 is undertaken. In case that it is determined that the subsequent processing should not be undertaken, the processing is completed.

Brief Description of Effects of Third Embodiment

The configuration of the demand target display device of the third embodiment makes it possible to avoid a situation in which the time presenting function would be completely lost, even in an environment in which electric energy supply has been suspended upon blackout, etc.

Fourth Embodiment

Concept of Fourth Embodiment

A demand target display device of a fourth embodiment is basically the same as that explained in any one of the first through the third embodiments. The demand target display device of the fourth embodiment is characterized in that a time information generation unit is included in a wattmeter for collection of electric charges. Such configuration makes it possible to simplify the function for generation of time information in regard to the structure of the inside of a housing of the demand target display device. Thus, it become possible to provide electric power consumers with a demand target display device that performs demand management upon clocking of time by electric power companies at a low cost.

Functional Configuration of Fourth Embodiment

Figure 13:
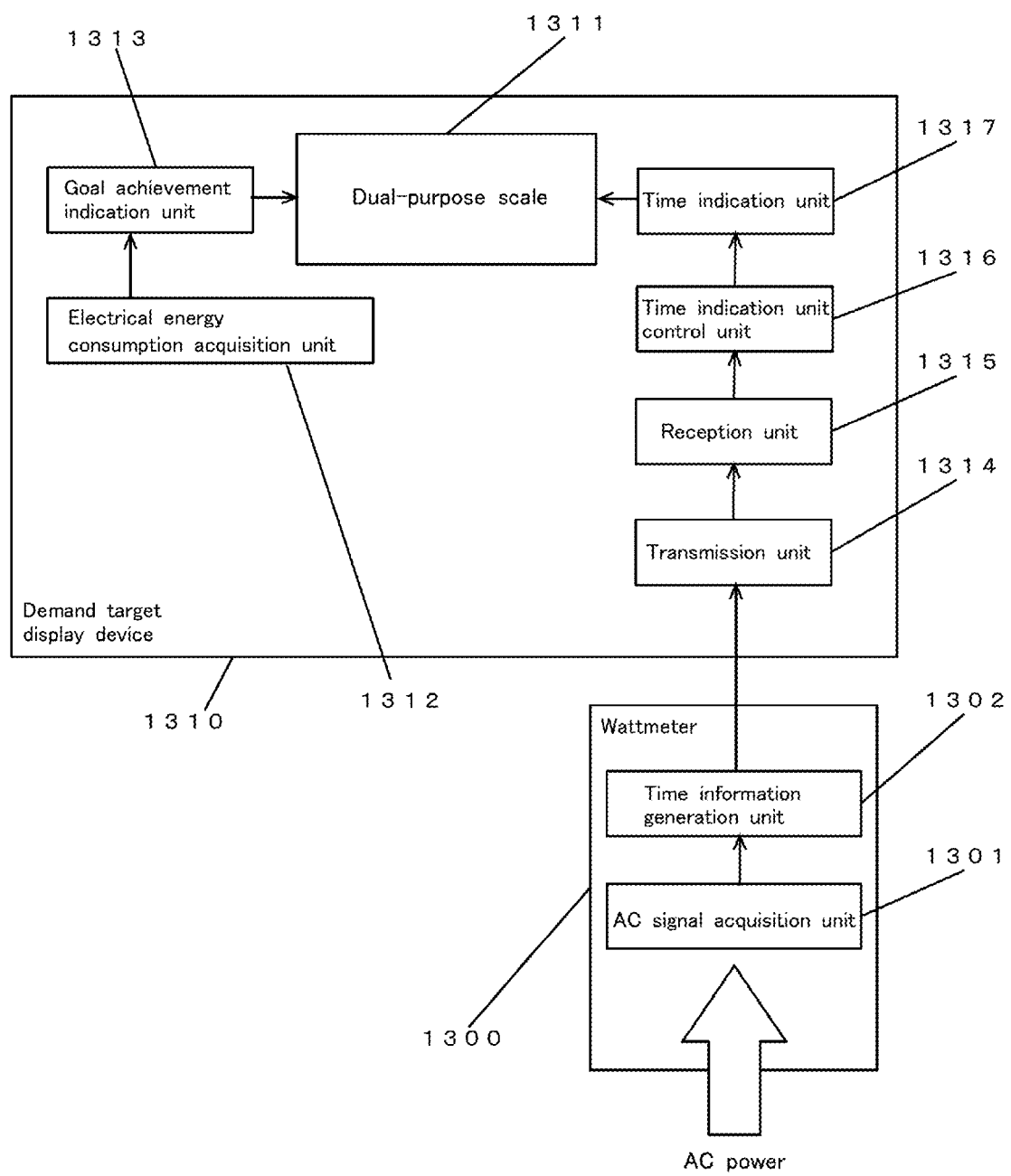
FIG. 13 is a diagram showing an example of functional block diagram of a demand target display device of a fourth embodiment.

FIG. 13 is a diagram showing an example of functional block diagram of a demand target display device of a fourth embodiment. As described in FIG. 13, the "demand target display device" (1310) of the fourth embodiment comprises a "dual-purpose scale" (1311), an "electrical energy consumption acquisition unit," (1312), a "goal achievement indication unit" (1313), a "transmission unit" (1314), a "reception unit" (1315), a "time indication unit control unit" (1316), and a "time indication unit" (1317). And a "wattmeter" (1300) for collection of electric charges comprises an "AC signal acquisition unit" (1301) and a "time information generation unit" (1302). Explanations of the demand target display device, which are not included in the explanations of the demand target display device of the FIG. 4 of the first embodiment or the like, or the like, are provided with a central focus on the wattmeter comprising the AC signal acquisition unit and the time information generation unit hereinafter.

According to the demand target display device of the fourth embodiment, the wattmeter for collection of electric charges comprises the time information generation unit. The term "wattmeter for collection of electric charges" refers to a watt-hour meter for measuring electrical energy through integration and metering of electrical energy provided to each home, office, and facility. Based on the electrical energy measured via such watt-hour meter, electric power companies compute amounts of electric charges to be collected from each home, etc. That is to say, the watt-hour meter explained in question can be a device in which a function for integration of electrical energy is added to the "wattmeter" (0806) shown in FIG. 8, for example. As explained above, the portion corresponding to basic charges from among electric charges established by electric power companies is determined based on a given demand value during a predetermined period. Electric power companies measure the aforementioned predetermined period and the demand value during such period using a wattmeter. Therefore, a wattmeter is required to retain a function for generation of time information upon clocking of the aforementioned predetermined period. Use of such function for generation of time information as a function of the demand target display device of the fourth embodiment makes it possible to omit the function for generation of time information from the structures inside the housing of the demand target display device. Thus, it is possible to provide consumers with a low-cost demand target display device.

It is possible for time information generated via the wattmeter to be transmitted to the demand target display device via a power supply line that connects the wattmeter with the demand target display device. Such transmitted time information is further transmitted from the transmission unit to the reception unit.

Specific Configuration of Demand Target Display Device

The specific configuration for the demand target display device of the fourth embodiment is basically the same as that explained in the first embodiment with reference to FIG. 8. Such configuration differs in that the wattmeter comprises the time information generation unit. Therefore, a time information generation program undertakes processing for reception by the transmission unit of time information generated via the wattmeter on a power supply line.

Processing Flow of Fourth Embodiment

Processing flow for the demand target display device of the fourth embodiment is basically the same as that explained in the first embodiment, except that an AC signal acquisition step is executed via the wattmeter rather than inside such device (i.e., a meter AC signal acquisition step).

Brief Description of Effects of Fourth Embodiment

As described above, use of the function for generation of time information retained via the wattmeter as a function of the demand target display device of the fourth embodiment makes it possible to simplify the function for generation of time information in regard to the structure of the inside of a housing of the demand target display device of the fourth embodiment. Thus, it become possible to provide electric power consumers with a demand target display device that performs demand management upon clocking of time by electric power companies at a low cost.

Fifth Embodiment

Concept of Fifth Embodiment

A demand target display device of a fifth embodiment is basically the same as that explained in any one of the first through the fourth embodiments. The demand target display device of the third embodiment is characterized in that the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale. The aforementioned configuration makes it possible to specifically and instantaneously understand the extent of the period during which energy-saving actions continue for goal achievement or whether or not energy-saving actions are necessary.

Functional Configuration of Fifth Embodiment

Figure 14:
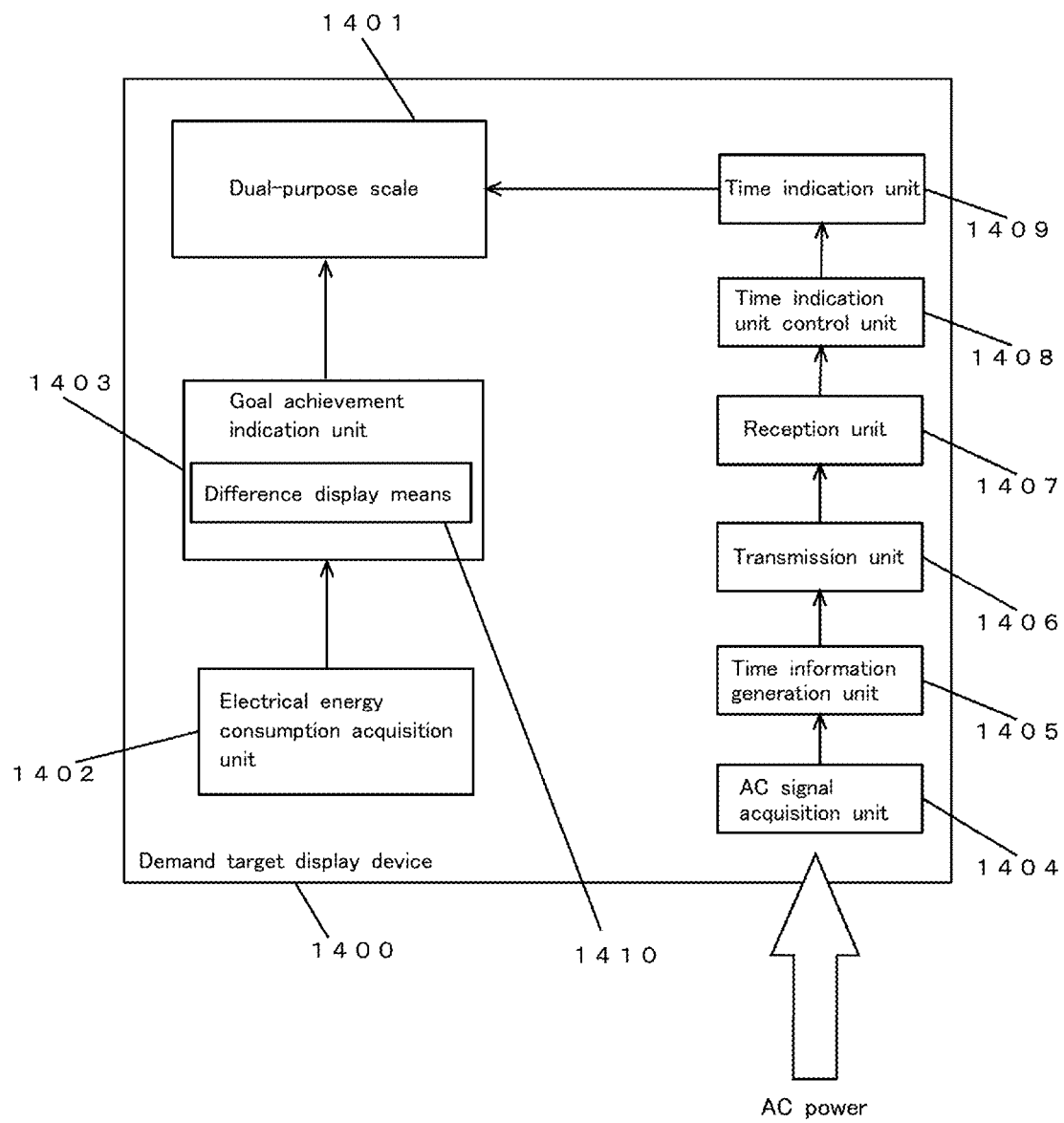
FIG. 14 is a diagram showing an example of functional block diagram of a demand target display device of the fifth embodiment.

FIG. 14 is a diagram showing an example of functional block diagram of a demand target display device of the fifth embodiment. As described in FIG. 14, the "demand target display device" (1400) of the fifth embodiment comprises a "dual-purpose scale" (1401), an "electrical energy consumption acquisition unit," (1402), a "goal achievement indication unit" (1403), an "AC signal acquisition unit" (1404), a "time information generation unit" (1405), a "transmission unit" (1406), a "reception unit" (1407), a "time indication unit control unit" (1408), and a "time indication unit" (1409). The goal achievement indication unit comprises a "difference display means" (1410). Explanations of the demand target display device, which are not included in the explanations of the demand target display device of the FIG. 4 of the first embodiment or the like, or the like, are provided with a central focus on the difference display means hereinafter.

The "difference display means" retains a function for acquiring information on predicted electrical energy consumption as electrical energy consumed within the segment for a given target demand value and indicating the difference between the predicted electrical energy consumption and the target demand value via the dual-purpose scale. The term "predicted electrical energy consumption" specifically refers to electrical energy consumption predicted to be consumed from the beginning to the end of a segment for a given target demand value to which the current time belongs. As an example for the method for prediction noted above, electrical energy consumed up to the current time using the information on electrical energy consumed from the beginning of the segment for a given target demand value up to the current time is computed, and the value resulting when the electrical energy consumption consumed in case that consumption of electrical energy at the same rate as that of the aforementioned electrical energy consumption is added to such electrical energy consumption is used.

Again, FIG. 6 is a diagram showing a specific method for computation of electrical energy consumption predicted until the end time of a time segment. As shown in FIG. 6, it is possible for linear function fitting to take place and for electrical energy consumption at the end of a corresponding time segment to be computed and predicted. That it is to say, based on electrical energy consumption B at the current time, electrical energy consumption 0 predicted at the end time of a predetermined time segment is computed and comparison operation is applied to the relationship with a target demand value a. FIG. 7 which has been already used for explanations is used an example of indication via the goal achievement indication unit of the device of the fifth embodiment. In case that the total of electrical energy consumption during the period from 10:00 to 10:18 is 18 KWh, under the condition that electricity consumption continues until 10:30 at the same rate, the total of electrical energy consumption will be 30 kWh for 30 minutes (including the remaining 12 minutes). The aforementioned configuration makes it possible for electric power consumers to predict whether or not they will be able to achieve a goal relating to electricity consumption actions at a future time that is the end time of a given time segment.

Processing for computation of electrical energy consumption to be predicted is undertaken at predetermined time intervals (e.g., at 15-second intervals or 1-minute intervals), and prediction data is updated on a case-by-case basis. The aforementioned predetermined time intervals are not required to be any particular intervals. It is also possible to increase frequency of the processing for updating of prediction data and reception processing as the end time of a relevant time segment becomes closer. The aforementioned configuration makes it possible to specifically indicate the degree of goal achievement based on the recent data for electric power consumers.

The expression "indicating the difference between the predicted electrical energy consumption and the target demand value via the dual-purpose scale" specifically refers to a situation in which it is indicated, using the dual-purpose scale, whether or not predicted electrical energy consumption at a predetermined time exceeds a target demand value, and/or whether or not there exists leeway, and furthermore, a situation in which the extent of such excess or leeway is indicated using the dual-purpose scale. Specific explanations will be given using the example above. In case that a target demand value during a period from 12:00 until 12:30 is 40 kWh, predicted electrical energy consumption at 12:18 is 30 kWh. Thus, at such time, indication to the effect that "leeway equivalent to 10 kWh in relation to the target demand value exists" is given on the dual-purpose scale As an example of "indicating . . . via the dual-purpose scale," such difference is represented by a higher value than the value for the current time when the difference is of a positive nature, and is represented by a lower value than the value for the current time when the difference is of a negative nature, under the condition that the difference is reckoned from the value for the current time shown on the dual-purpose scale. That is to say, in case that the difference is of a positive nature or a negative nature, separate indication other than indication of the current time is made using the dual-purpose scale. In case that the difference noted above is of a positive nature, the predicted electrical energy consumption exceeds a target demand value. In case that the difference noted above is of a negative nature, the predicted electrical energy consumption is less than a target demand value. In other words, a state of excess in the former case and a state of non-excess in the latter case are indicated on the dual-purpose scale. In case that electricity consumption continues at the pace noted above, the aforementioned configuration exhibits manifestly apparent results as to whether or not electrical energy consumption is predicted to exceed a target demand value.

Figure 15A:
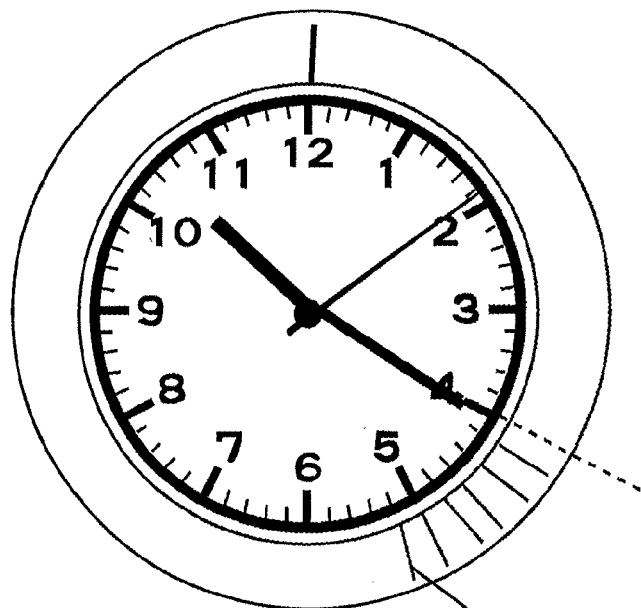
FIGS. 15(*a*) and (*b*) are diagrams showing examples of a function of a difference display means of a demand target display device of the fifth embodiment.
Figure 15B:
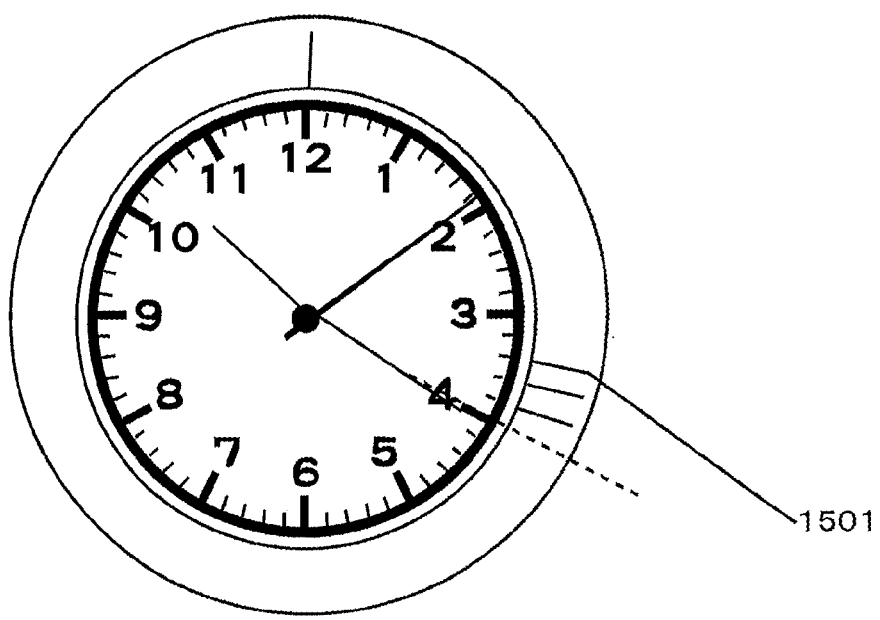

A method for indication of the extent of difference (percentage of the difference indicated on the dual-purpose scale) is determined based on the unit established for electrical energy consumption and the number of marks. FIGS. 15(*a*) and (*b*) show examples of a function of a difference display means. The time segment is set as 30 minutes from 10:00 until 10:30. The target demand value during such time segment is 60 kWh. In case that electrical energy consumption after 20 minutes have elapsed is 48 kWh, predicted electrical energy consumption at the end of the time segment is 72 kWh. The extent of the excess consumption is 12 kWh. In such case, the number of marks on the scale per time segment is 30, and each mark represents a difference of 2 kWh from a neighboring mark. Thus, in such case, the difference of a positive nature is represented by 6 marks beyond the mark corresponding to the value for the current time ((a) of FIG. 15). To the contrary, in case that electrical energy consumption at the aforementioned time is 36 kWh, predicted electrical energy consumption at the end of the aforementioned time segment is 54 kWh. The extent of consumption leeway is 6 kWh. Thus, in such case, the difference of a negative nature is represented by 3 marks before the mark corresponding to the value for the current time ((b) of FIG. 15). When users look at the demand target display device on which such results are indicated, in the former case, it is possible to recognize the need to undertake energy-saving actions in order to reduce electrical energy consumption by an amount equivalent to an amount that would be consumed within a period of 6 minutes. In the latter case, it is possible to recognize that there exists leeway for electricity consumption equivalent to an amount that would be consumed within a period of 3 minutes. The aforementioned configuration concerning the indication method of the dual-purpose scale makes it possible for users to recognize whether or not a target demand value is exceeded at the current time upon looking at the demand target display device. It also makes it possible for such users to recognize the relationship between the electrical energy consumption at the current time and the target demand value through specific numeric values. Thus, the aforementioned configuration exhibits manifestly apparent results as to whether or not electrical energy consumption exceeds a target demand value and how much time should be used for energy-saving actions so that users will be able to avoid surpassing the target.

The aforementioned steps constitute an example. Methods of indication are not limited to the aforementioned methods. More specifically, the same indication can be undertaken with reference to all marks corresponding to the numbers of the dual-purpose scale. Alternatively, the top portion only of the marks representing excess or leeway on the dual-purpose scale can be used for indication. Furthermore, it is acceptable for a difference of a positive nature and a difference of a negative nature to be indicated using different colors. The aforementioned configuration makes it possible to easily recognize whether or not the difference is of a positive nature or of a negative nature, even from a great distance.

Specific Configuration of Demand Target Display Device

The specific configuration for the demand target display device of the fifth embodiment is basically the same as that explained in the first embodiment with reference to FIG. 8. Explanations of the demand target display device of the fifth embodiment, which are not included in the explanations of the demand target display device of the FIG. 8 of the first embodiment, are provided with a central focus on specific processing of the difference display means hereinafter.

Specific Processing via Difference Display Means

The CPU loads the information on electrical energy consumption obtained through execution of a program for acquiring information on electrical energy consumption, undertakes arithmetic processing for computation of electrical energy predicted to be consumed up to the ending point of a segment for a given target demand value, compares and computes the results of the aforementioned processing and the information on the target demand value, and stores the results thereof in the predetermined address of the main memory.

Subsequently, the CPU loads the information on the predicted electrical energy consumption and the information on the target demand value, executes a difference indication program, computes the difference between the predicted electrical energy consumption and the target demand value, and stores the results thereof in the predetermined address of the main memory. Based on such difference information, processing for indication via the dual-purpose scale is undertaken.

Processing Flow of Fifth Embodiment

Figure 16:
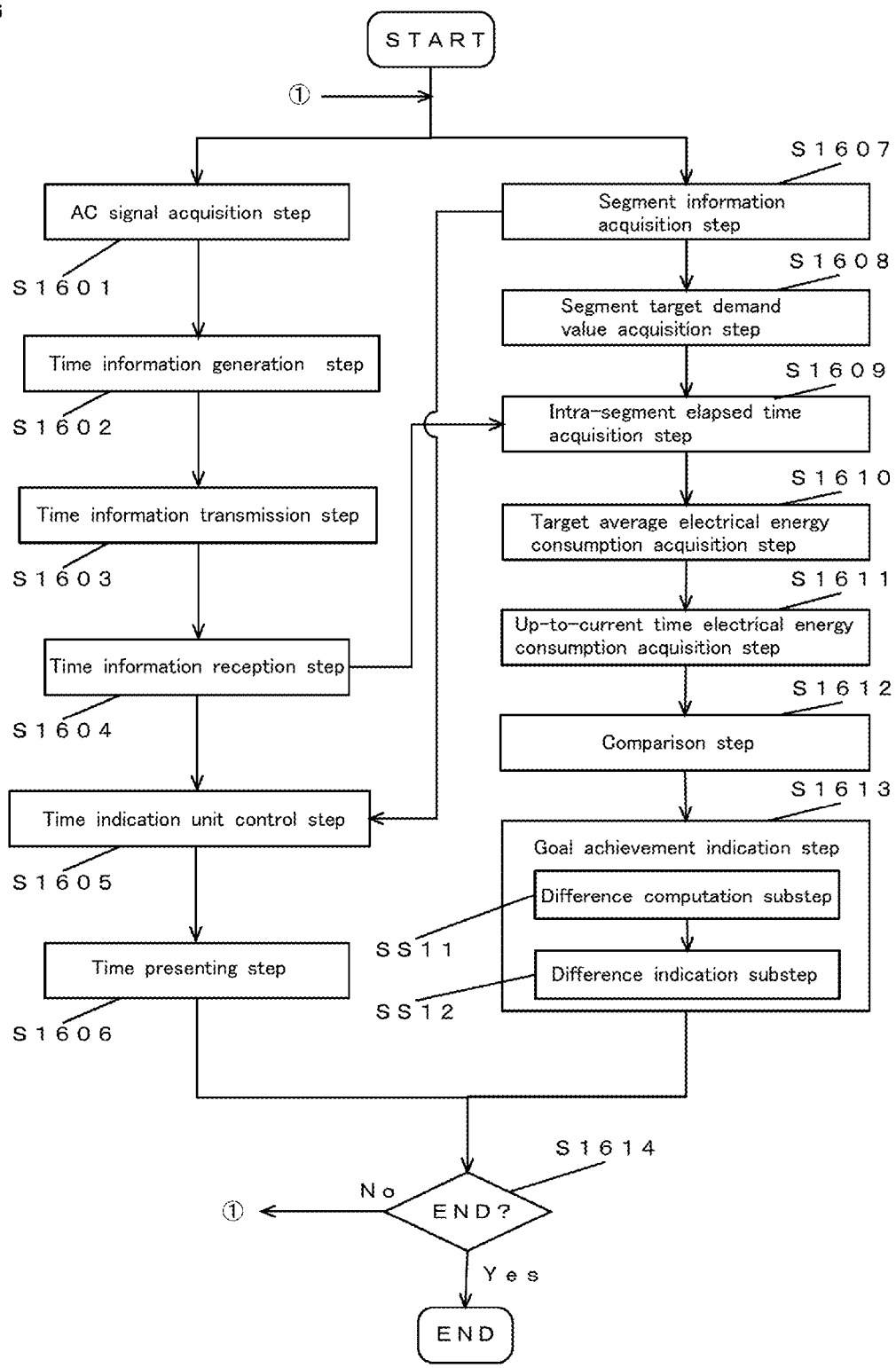
FIG. 16 is a diagram showing an example of progression of the process of a demand target display device of the fifth embodiment.

FIG. 16 is a diagram showing an example of progression of the process of a demand target display device of the fifth embodiment. The processing flow of FIG. 16 comprises the following steps. Initially, AC signals based on the AC waveform of AC power from a power supply line is obtained (S1601: AC signal acquisition step). Next, time information based on the acquired AC signals is generated (S1602: time information generation step). The generated time information is transmitted via radio waves (S1603: time information transmission step). Subsequently, the aforementioned time information is received within a housing (S1604: time information reception step). The time indication unit is controlled based on segment information acquired via a segment information acquisition step noted below and the aforementioned time information received via the time information reception step (S1605: time indication unit control step). Time is indicated on the dual-purpose scale based on the information controlled via the time indication unit control step (S1606: time presenting step).

The information relating to a given time segment is obtained (S1607: segment information acquisition step). A segment target demand value determined based on the segment information acquired above is obtained (S1608: segment target demand value acquisition step). Furthermore, the information on the time elapsed within the aforementioned segment is acquired based on the time information generated via the time information generation step, for example (S1609: intra-segment elapsed time acquisition step). Target average electrical energy consumption in a percent form corresponding to the intra-segment elapsed time acquired above in relation to the entire segment is computed (S1610: target average electrical energy consumption acquisition step). Information is obtained on electrical energy consumption from the aforementioned segment commencement until the current time (S1611: up-to-current time electrical energy consumption acquisition step). Subsequently, the aforementioned target average electrical energy consumption and the aforementioned up-to-current time electrical energy consumption are compared (S1612: comparison step). Based on the result of the processing via the comparison step, the degree of goal achievement is indicated on the dual-purpose scale (S1613: goal achievement indication step). More specifically, the difference between the predicted electrical energy consumption to be consumed in the future and the target demand value is computed (SS11: difference computation substep). Furthermore, the aforementioned difference is indicated on the dual-purpose scale (SS12: difference indication substep).

After the time presenting step and the goal achievement indication step have been undertaken, it is determined via the step 1614 whether or not the subsequent processing should be undertaken. In case that it is determined that the subsequent processing should be undertaken, processing after the step 1601 and the step 1607 is undertaken. In case that it is determined that the subsequent processing should not be undertaken, the processing is completed.

Brief Description of Effects of Fifth Embodiment

According to the demand target display device of the fifth embodiment, the aforementioned configuration makes it possible to specifically and instantaneously understand the extent of period during which energy-saving actions continue for goal achievement or whether or not energy-saving actions are not necessary.

What is claimed is:

1. A demand target display device; comprising:
   a dual-purpose scale for indicating time and electrical energy consumption;
   a time indication unit for indicating time via the dual-purpose scale;
   an electrical energy consumption acquisition unit for acquiring electrical energy consumed up to the current time within a given segment for a given target demand value including the current time;
   a goal achievement indication unit for indicating the relationship between electrical energy consumption within a given segment recorded via the electrical energy consumption acquisition unit and a target demand value set for such segment;
   an AC signal acquisition unit for acquiring AC signals based on the AC waveform of AC power from a power supply line;
   a time information generation unit for generating time information based on the acquired AC signals;
   a transmission unit for transmitting the generated time information via radio waves within a housing;
   a reception unit for receiving the transmitted time information via radio waves within the housing; and
   a time indication unit control unit for controlling the time indication unit via the received time information.

2. The demand target display device according to claim 1, wherein an electromagnetic shield is applied to the radio waves transmitted from the transmission unit via the housing and/or an electromagnetic shield unit within the housing so that such radio waves will not leak outside the housing.

3. The demand target display device according to claim 2, further comprising an external time information acquisition unit for receiving standard time radio waves and outputting time information to the time information generation unit.

4. The demand target display device according to claim 3, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

5. The demand target display device according to claim 3, wherein a wattmeter for collection of electrical fees comprises the time information generation unit.

6. The demand target display device according to claim 5, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

7. The demand target display device according to claim 2, wherein a wattmeter for collection of electrical fees comprises the time information generation unit.

8. The demand target display device according to claim 7, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

9. The demand target display device according to claim 2, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

10. The demand target display device according to claim 1, further comprising an external time information acquisition unit for receiving standard time radio waves and outputting time information to the time information generation unit.

11. The demand target display device according to claim 10, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

12. The demand target display device according to claim 10, wherein a wattmeter for collection of electrical fees comprises the time information generation unit.

13. The demand target display device according to claim 12, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

14. The demand target display device according to claim 1, wherein a wattmeter for collection of electrical fees comprises the time information generation unit.

15. The demand target display device according to claim 14, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

16. The demand target display device according to claim 1, wherein the goal achievement indication unit acquires information on predicted electrical energy consumption as electrical energy consumed within the segment for a given target demand value and retains a difference display means for indicating the difference between the predicted electrical energy consumption and the target demand value via the dual-purpose scale.

* * * * *